(12) United States Patent
Ye et al.

(10) Patent No.: US 11,145,829 B2
(45) Date of Patent: Oct. 12, 2021

(54) ORGANIC ELECTROLUMINESCENT DEVICE, ORGANIC ELECTROLUMINESCENT DISPLAY DEVICE INCLUDING THE SAME, AND ORGANOMETALLIC COMPOUND FOR ORGANIC ELECTROLUMINESCENT DEVICE

(71) Applicant: Samsung Display Co., Ltd., Yongin-si (KR)

(72) Inventors: Jimyoung Ye, Suwon-si (KR); Myeongsuk Kim, Hwaseong-si (KR); Byeongwook Yoo, Hwaseong-si (KR); Yiseul Kim, Yongin-si (KR); Hyoyeon Kim, Hwaseong-si (KR); Jaehoon Hwang, Seoul (KR)

(73) Assignee: Samsung Display Co., Ltd.

( * ) Notice: Subject to any disclaimer, the term of this patent is extended or adjusted under 35 U.S.C. 154(b) by 444 days.

(21) Appl. No.: 16/260,104

(22) Filed: Jan. 29, 2019

(65) Prior Publication Data
US 2019/0245154 A1 Aug. 8, 2019

(30) Foreign Application Priority Data
Feb. 2, 2018 (KR) .......................... 10-2018-0013609

(51) Int. Cl.
*H01L 51/00* (2006.01)
*H01L 51/50* (2006.01)
(Continued)

(52) U.S. Cl.
CPC ........ *H01L 51/0087* (2013.01); *C07F 15/002* (2013.01); *C07F 15/0033* (2013.01);
(Continued)

(58) Field of Classification Search
CPC ............... H01L 51/0087; C07F 15/002; C07F 15/0033; C07F 15/0086; C09K 2211/185
See application file for complete search history.

(56) References Cited

U.S. PATENT DOCUMENTS 4,471,122 A 9/1984 Crenshaw et al.
9,741,940 B2 8/2017 Yamamoto et al.
(Continued)

FOREIGN PATENT DOCUMENTS

JP 2011187783 A * 9/2011
JP 5135660 2/2013
(Continued)

OTHER PUBLICATIONS

Linder, T. et al; Synthesis of pi-extended thiadiazole (oxides) and their electronic properties, Org. Lett, 12 (20), Sep. 16, 2010, 4520-3. (Year: 2010).*

*Primary Examiner* — Jennifer A Boyd
*Assistant Examiner* — Sean M DeGuire
(74) *Attorney, Agent, or Firm* — H.C. Park & Associates, PLC

(57) ABSTRACT

An organic electroluminescent device includes a first electrode, a hole transport region provided on the first electrode, an emission layer provided on the hole transport region, an electron transport region provided on the emission layer, and
(Continued)

a second electrode provided on the electron transport region, wherein the emission layer includes an organometallic compound represented by Formula 1.

[Formula 1]

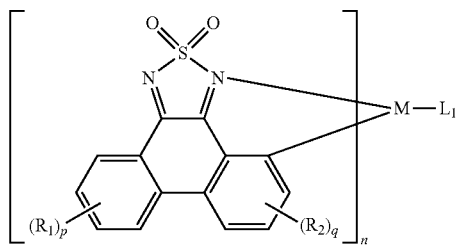

18 Claims, 7 Drawing Sheets

(51) Int. Cl.
*H01L 27/32* (2006.01)
*C07F 15/00* (2006.01)

(52) U.S. Cl.
CPC ...... *C07F 15/0086* (2013.01); *H01L 27/3246* (2013.01); *H01L 27/3276* (2013.01); *H01L 51/0085* (2013.01); *H01L 51/0088* (2013.01); *H01L 51/5012* (2013.01); *H01L 51/5092* (2013.01); *C09K 2211/185* (2013.01); *H01L 27/3213* (2013.01); *H01L 51/0059* (2013.01); *H01L 51/0067* (2013.01); *H01L 51/0072* (2013.01); *H01L 51/0081* (2013.01); *H01L 51/5016* (2013.01); *H01L 51/5056* (2013.01); *H01L 51/5072* (2013.01)

(56) References Cited

U.S. PATENT DOCUMENTS

2010/0141125 A1 6/2010 Otsu et al.
2013/0256647 A1* 10/2013 Nishide ............... H01L 51/0052
                                                    257/40
2017/0077426 A1 3/2017 Xia et al.

FOREIGN PATENT DOCUMENTS

| JP | 5256484 | 8/2013 |
| JP | 5577650 | 8/2014 |
| JP | 5666111 | 2/2015 |
| KR | 10-1985-0000759 | 5/1985 |
| KR | 10-2013-0018547 | 2/2013 |
| KR | 10-2017-0028268 | 3/2017 |

* cited by examiner

ORGANIC ELECTROLUMINESCENT DEVICE, ORGANIC ELECTROLUMINESCENT DISPLAY DEVICE INCLUDING THE SAME, AND ORGANOMETALLIC COMPOUND FOR ORGANIC ELECTROLUMINESCENT DEVICE

CROSS-REFERENCE TO RELATED APPLICATION

This application claims priority from and the benefit of Korean Patent Application No. 10-2018-0013609, filed on Feb. 2, 2018, which is hereby incorporated by reference for all purposes as if fully set forth herein.

BACKGROUND

Field

Exemplary embodiments/implementations of the invention relate generally to an organic electroluminescent device, an organic electroluminescent display device including the same, and an organometallic compound used in the organic electroluminescent device.

Discussion of the Background

The development of an organic electroluminescent display as an image display is being actively conducted. The organic electroluminescent display is different from a liquid crystal display and is a so called self-luminescent display accomplishing displays via the recombination of holes and electrons injected from a first electrode and a second electrode in an emission layer and via light emission from a luminescent material including an organic compound in the emission layer.

As an organic electroluminescent device, an organic device including, for example, a first electrode, a hole transport layer disposed on the first electrode, an emission layer disposed on the hole transport layer, an electron transport layer disposed on the emission layer, and a second electrode disposed on the electron transport layer is well known. Holes are injected from the first electrode, and the injected holes move via the hole transport layer and are injected into the emission layer. Meanwhile, electrons are injected from the second electrode, and the injected electrons move via the electron transport layer and are injected into the emission layer. The holes and electrons injected into the emission layer recombine to produce excitons in the emission layer. The organic electroluminescent device emits light using light generated by the transition of the excitons to a ground state. In addition, an embodiment of the configuration of the organic electroluminescent device is not limited thereto, but various modifications may be possible.

The above information disclosed in this Background section is only for understanding of the background of the inventive concepts, and, therefore, it may contain information that does not constitute prior art.

SUMMARY

Exemplary embodiments of the inventive concepts provide an organic electroluminescent device, an organic electroluminescent display device including the same, and an organometallic compound for an organic electroluminescent device. More particularly, the exemplary embodiments provide an organic electroluminescent device which is capable of emitting near-infrared rays, an organic electroluminescent display device including the same, and an organometallic compound used as a luminescent material emitting near-infrared rays.

Additional features of the inventive concepts will be set forth in the description which follows, and in part will be apparent from the description, or may be learned by practice of the inventive concepts.

An exemplary embodiment of the inventive concept discloses an organic electroluminescent device including a first electrode, a hole transport region provided on the first electrode, an emission layer provided on the hole transport region, an electron transport region provided on the emission layer, and a second electrode provided on the electron transport region, wherein the emission layer includes an organometallic compound represented by the following Formula 1:

[Formula 1]

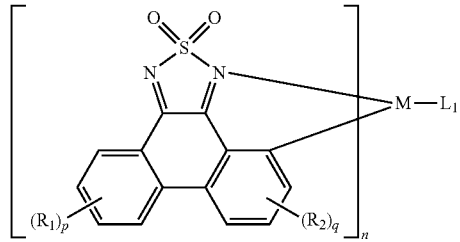

In Formula 1, $R_1$ and $R_2$ are each independently a hydrogen atom, a deuterium atom, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a ring, "p" is an integer of 0 to 4, "q" is an integer of 0 to 3, "n" is 1 or 2, M is Pt, Ir or Os, and $L_1$ is a bidentate ligand.

In an exemplary embodiment, $L_1$ may be represented by one of the following Formulae 2-1 to 2-6:

[Formula 2-1]

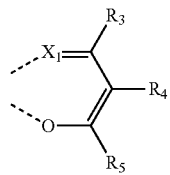

[Formula 2-2]

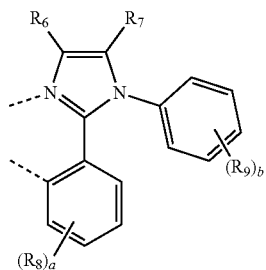

[Formula 2-3]

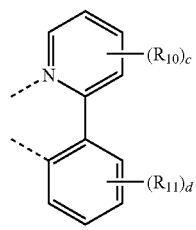

[Formula 2-4]

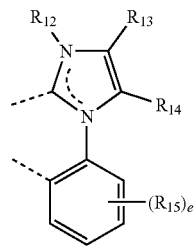

[Formula 2-5]

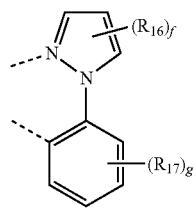

[Formula 2-6]

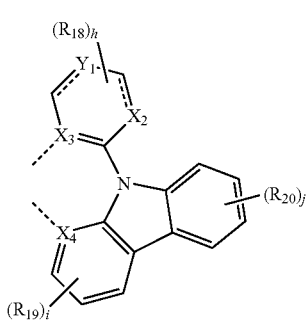

In Formulae 2-1 to 2-6, $X_1$ is O or NR', $X_2$ to $X_4$ are each independently CH, N, or $NR_{21}$, $Y_1$ is a direct linkage or CH, R', and $R_3$ to $R_{21}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, "a", "c", "d", "e", "g" and "j" are each independently an integer of 0 to 4, "b" is an integer of 0 to 5, "f" and "i" are integers of 0 to 3, and "h" is an integer of 0 to 2.

In an exemplary embodiment, M may be Pt.

In an exemplary embodiment, Formula 1 may be represented by one of the following Formulae 1-1 to 1-3:

[Formula 1-1]

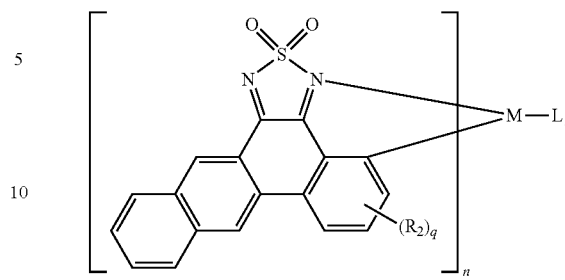

[Formula 1-2]

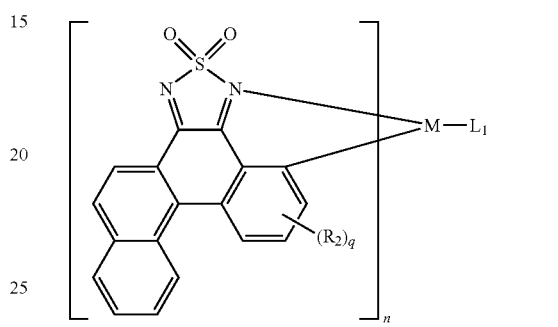

[Formula 1-3]

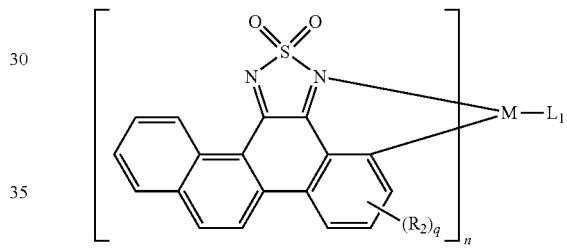

In Formulae 1-1 to 1-3, M, $R_2$, $L_1$, "n" and "q" are the same as described above.

In an exemplary embodiment, the emission layer may include a host and a dopant and emit near-infrared rays in a wavelength region of about 750 nm to about 1,000 nm, and the dopant may include the organometallic compound represented by Formula 1.

In an exemplary embodiment of the inventive concept, an organic electroluminescent display device includes a first pixel including a first organic electroluminescent device which emits first visible rays, a second pixel including a second organic electroluminescent device which emits second visible rays, a third pixel including a third organic electroluminescent device which emits third visible rays, and a fourth pixel including a fourth organic electroluminescent device which emits near-infrared rays, wherein the fourth organic electroluminescent device includes an emission layer including the above-described organometallic compound represented by Formula 1.

In an exemplary embodiment of the inventive concept, the above-described organometallic compound represented by Formula 1 is provided.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the inventive concepts, and together with the description serve to explain the inventive concepts.

DETAILED DESCRIPTION OF THE ILLUSTRATED EMBODIMENTS

Figure 1:
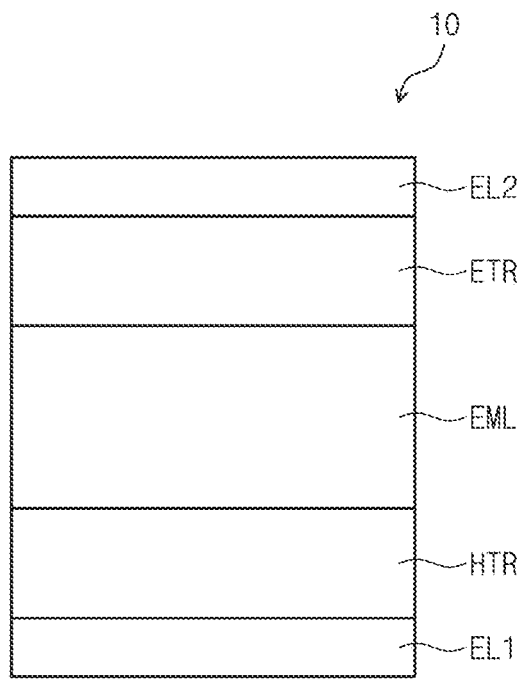
FIG. 1 is a cross-sectional view schematically illustrating an organic electroluminescent device according to an exemplary embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The above objects, other objects, features and advantages of the inventive concept will be easily understood from preferred exemplary embodiments with reference to the accompanying drawings. The inventive concept may, however, be embodied in different forms and should not be construed as limited to the embodiments set forth herein.

Like reference numerals refer to like elements for explaining each drawing. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers may also be present. On the contrary, when a layer, a film, a region, a plate, etc. is referred to as being "under" another part, it can be "directly under" the other part, or intervening layers may also be present.

First, referring to FIGS. 1 and 2, an organic electroluminescent device according to an exemplary embodiment of the inventive concept will be explained.

FIG. 1 is a cross-sectional view schematically illustrating an organic electroluminescent device according to an exemplary embodiment of the inventive concept. FIG. 2 is a cross-sectional view schematically illustrating an organic electroluminescent device according to an exemplary embodiment of the inventive concept.

Figure 2:
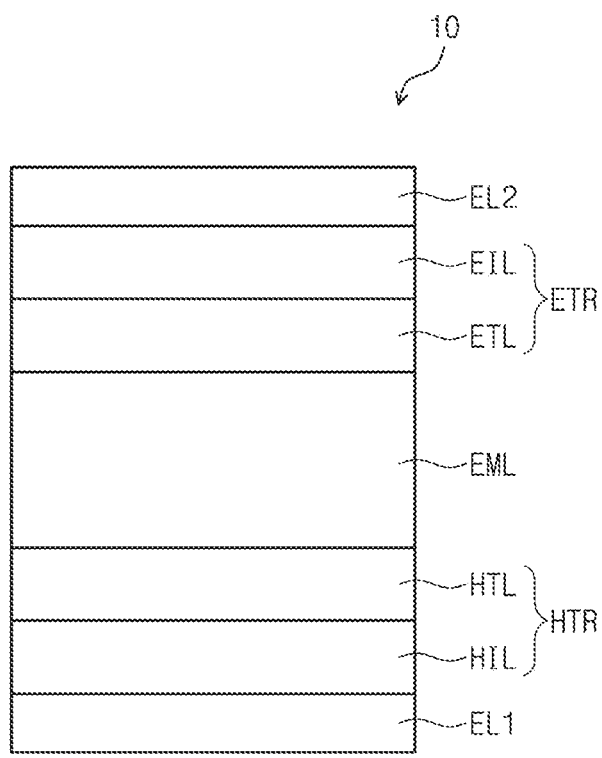
FIG. 2 is a cross-sectional view schematically illustrating an organic electroluminescent device according to an exemplary embodiment of the inventive concept.

Referring to FIGS. 1 and 2, an organic electroluminescent device 10 according to an exemplary embodiment of the inventive concept may include a first electrode EL1, a hole transport region HTR, an emission layer EML, an electron transport region ETR, and a second electrode EL2.

The first electrode EL1 and the second electrode EL2 are oppositely disposed, and between the first electrode EL1 and the second electrode EL2, a plurality of organic layers may be disposed. The plurality of the organic layers may include a hole transport region HTR, an emission layer EML and an electron transport region ETR.

The first electrode EL1 has electrical conductivity. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, and a transparent conductive layer formed using ITO, IZO, ZnO, or ITZO. For example, the first electrode EL1 may have a three-layer structure of ITO/Ag/ITO. However, exemplary embodiments of the inventive concepts are not limited thereto.

The thickness of the first electrode EL1 may be from about 1,000 Å to about 10,000 Å, for example from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, for example, from about 1,000 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL and a hole transport layer HTL, or may have a structure of a single layer formed using a hole injection material and a hole transport material. In addition, the hole transport region HTR may have a structure of a single layer formed using a plurality of different materials, or a structure laminated one by one from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4', 4"-tris(N,N-diphenylamino)triphenylamine (TDATA), 4,4', 4"-tris {N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-dinaphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL includes, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris (N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 100 Å to about 10,000 Å, for example, from about 100 Å to about 1,000 Å. If the hole transport region HTR includes both the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 30 Å to about 1,000 Å. If the thicknesses of the hole transport region HTR, the hole injection layer HIL, and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide, molybdenum oxide, etc., without limitation.

As described above, the hole transport region HTR may further include at least one of a hole buffer layer or an electron blocking layer in addition to the hole injection layer HIL and the hole transport layer HTL. The hole buffer layer may compensate a resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR to the hole transport region HTR.

The emission layer EML is provided on the hole transport region HTR. The thickness of the emission layer EML may be, for example, from about 100 Å to about 1,000 Å, or about 100 Å to about 300 Å. The emission layer EML may have a single layer formed using a single material, a single layer formed using a plurality of different materials, or a multilayer structure having a plurality of layers formed using a plurality of different materials.

The emission layer EML included in the organic electroluminescent device 10 according to an exemplary embodiment of the inventive concept is an emission layer emitting near-infrared rays. The emission layer EML includes a luminescent material of near-infrared rays. The emission layer EML includes an organometallic compound represented by Formula 1, which will be explained later.

Particulars on the material, the emission wavelength, etc. of the emission layer EML will be explained later.

The electron transport region ETR is provided on the emission layer EML. The electron transport region ETR may include at least one of an electron blocking layer, an electron transport layer ETL, or an electron injection layer EIL, without limitation.

The electron transport region ETR may have a single layer formed using a single material, a single layer formed using a plurality of different materials, or a multilayer structure including a plurality of layers formed using a plurality of different materials.

For example, the electron transport region ETR may have the structure of a single layer such as an electron injection layer EIL and an electron transport layer ETL, or a single layer structure formed using an electron injection material and an electron transport material. In addition, the electron transport region ETR may have a single layer structure formed using a plurality of different materials, or a structure laminated one by one from the emission layer EML of electron transport layer ETL/electron injection layer EIL, or hole blocking layer/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes the electron transport layer ETL, the electron transport region ETR may include an anthracene-based compound. However, exemplary embodiments of the inventive concepts are not limited thereto. The electron transport region may include, for example, tris(8-hydroxyquinolinato)aluminum (Alq$_3$), 1,3, 5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof, without limitation. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include LiF, lithium quinolate (LiQ), $Li_2O$, BaO, NaCl, CsF, a metal in lanthanoides such as Yb, or a metal halide such as RbCl and RbI, without limitation. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer, as described above. The hole blocking layer may include, for example, at least one of 2,9-dimethyl-4,7-diphenyl-1,10-phenanthroline (BCP), or 4,7-diphenyl-1,10-phenanthroline (Bphen), without limitation.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Even though not shown, the second electrode EL2 may be connected with an auxiliary electrode. If the second electrode EL2 is connected with the auxiliary electrode, the resistance of the second electrode EL2 may be decreased.

In the organic electroluminescent device 10, voltages are applied to each of the first electrode EL1 and the second electrode EL2, and holes injected from the first electrode EL1 move via the hole transport region HTR to the emission layer EML, and electrons injected from the second electrode EL2 move via the electron transport region ETR to the emission layer EML. The electrons and the holes are recombined in the emission layer EML to generate excitons, and the excitons may emit light via transition from an excited state to a ground state.

If the organic electroluminescent device 10 is a top emission type, the first electrode EL1 may be a reflective electrode, and the second electrode EL2 may be a transmissive electrode or a transflective electrode. If the organic electroluminescent device 10 is a bottom emission type, the first electrode EL1 may be the transmissive electrode or the transflective electrode, and the second electrode EL2 may be the reflective electrode.

The organic electroluminescent device 10 according to an exemplary embodiment of the inventive concept is characterized in emitting near-infrared rays, and has effects of high efficiency, etc.

Referring to FIGS. 3 to 9, an organic electroluminescent display device according an exemplary embodiment of the inventive concept will be explained. The explanation will be mainly with the difference from the above-explanation on the organic electroluminescent device according to an exemplary embodiment of the inventive concept, and unexplained part will follow the above-description.

Figure 3:
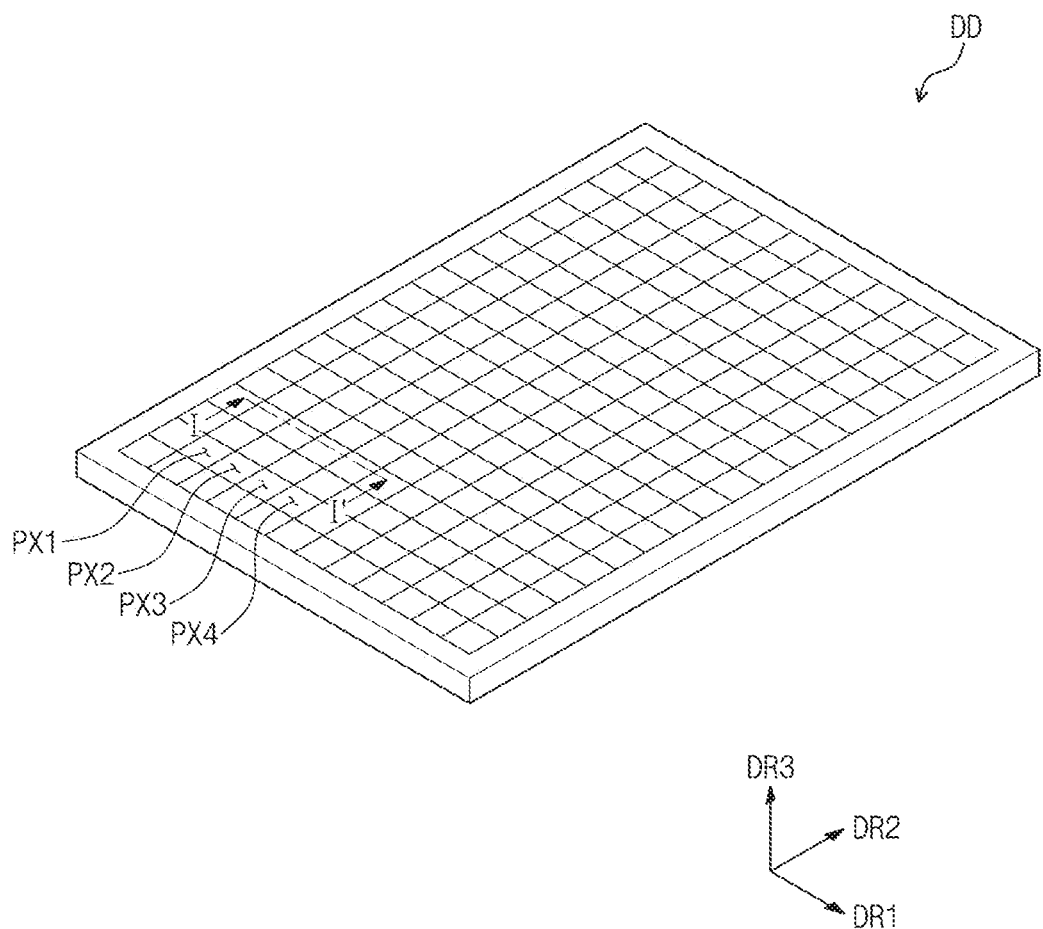
FIG. 3 is a perspective view of an organic electroluminescent display device according to an exemplary embodiment of the inventive concept.

FIG. 3 is a perspective view of an organic electroluminescent display device according to an exemplary embodiment of the inventive concept.

Referring to FIG. 3, an organic electroluminescent display device DD according to an exemplary embodiment of the inventive concept includes a plurality of pixels. FIG. 3 illustrates four kinds of pixels, and particularly, illustrates a case including a first pixel PX1, a second pixel PX2, a third pixel PX3 and a fourth pixel PX4. Four kinds of the pixels PX1, PX2, PX3 and PX4 may produce lights in different wavelength regions, respectively.

For example, the four kinds of pixels PX1, PX2, PX3 and PX4 may be arranged in a matrix shape on a plane defined by an axis in a first direction DR1 and an axis in a second direction DR2. In addition, each of the four kinds of pixels PX1, PX2, PX3 and PX4 may be arranged while making a row in the second direction DR2. However, exemplary embodiments of the inventive concepts are not limited thereto. The arrangement of a plurality of the pixels may be diversely modified according to embodiment methods of a display panel. In addition, each of the pixels PX1, PX2, PX3 and PX4 which generate lights in different wavelength regions is defined as a sub-pixel, and the combination of such sub-pixels may be defined as a pixel (PX of FIG. 4).

Each of the four kinds of pixels PX1, PX2, PX3 and PX4 includes an organic electroluminescent device including an emission layer emitting light in a different wavelength region from each other. This will be described later.

Figure 4:
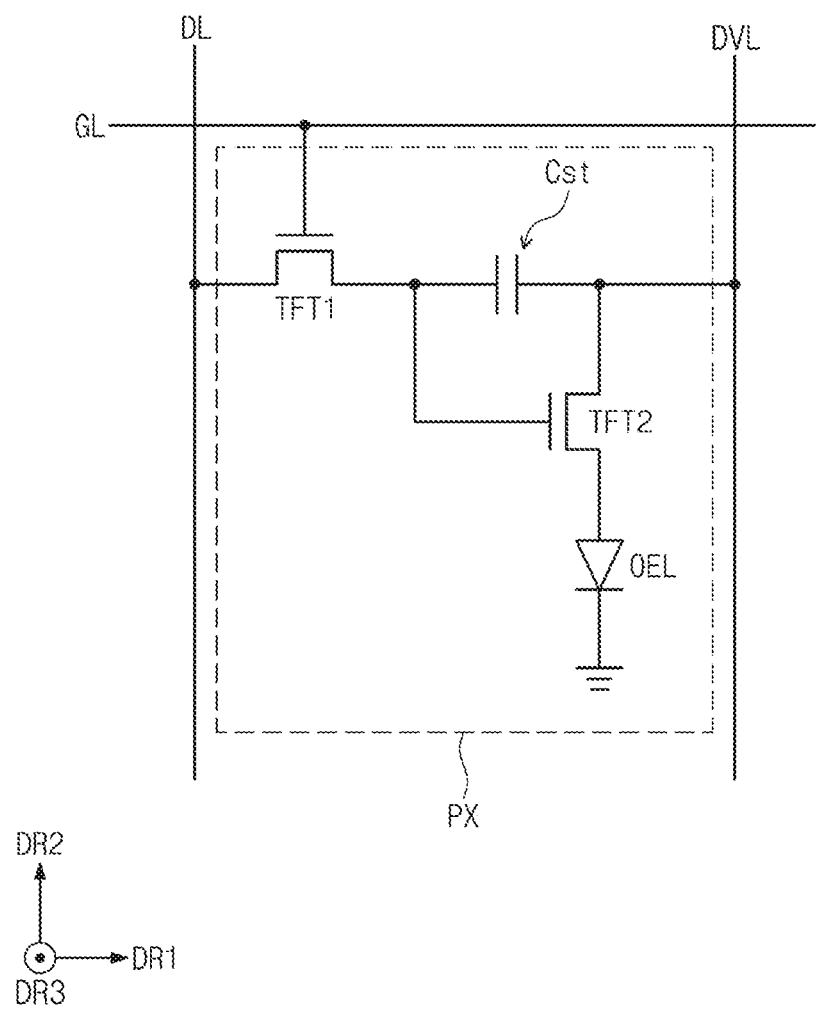
FIG. 4 is a circuit diagram of a pixel included in an organic electroluminescent display device according to an exemplary embodiment of the inventive concept.
Figure 5:
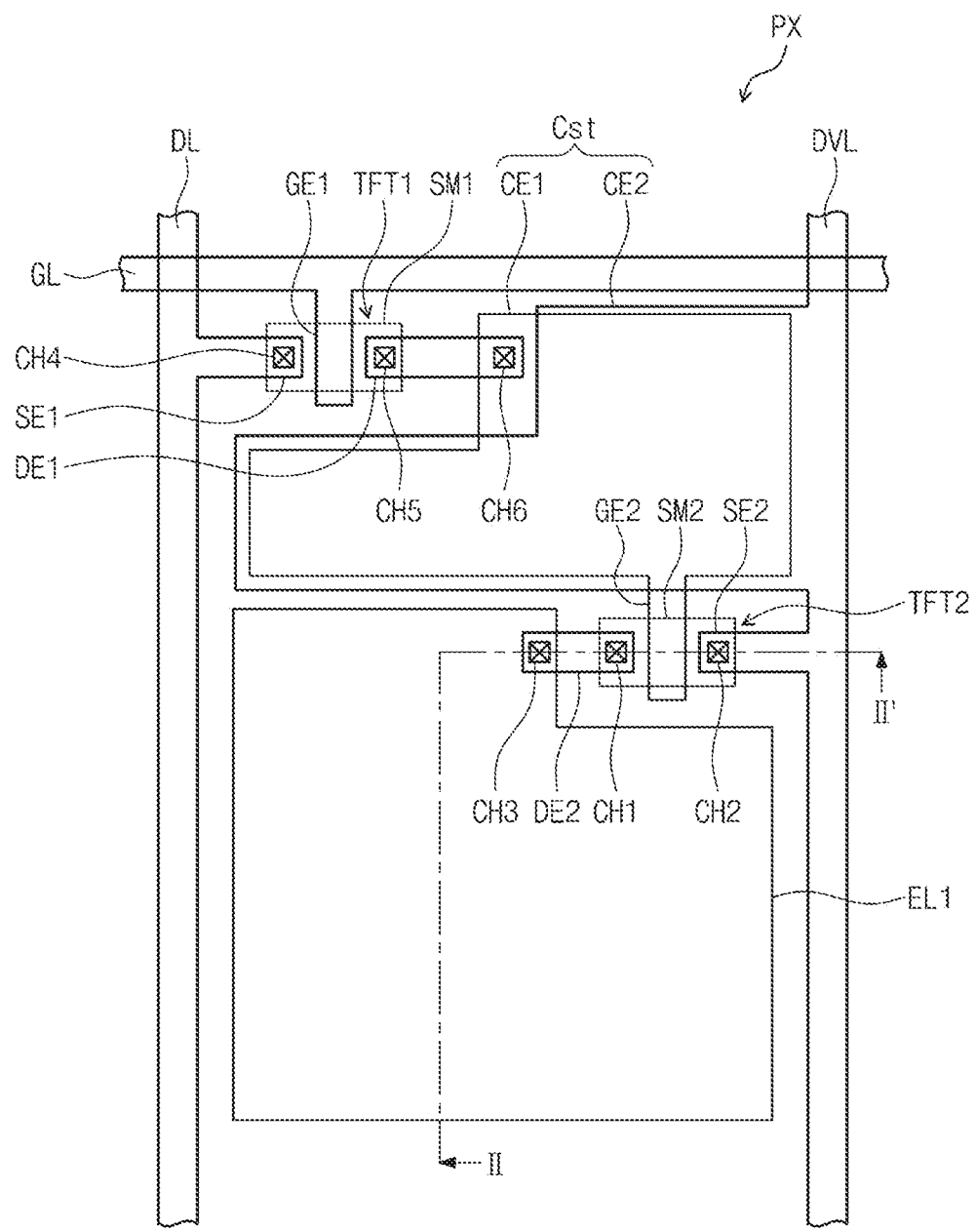
FIG. 5 is a plan view showing a pixel included in an organic electroluminescent display device according to an exemplary embodiment of the inventive concept.
Figure 6:
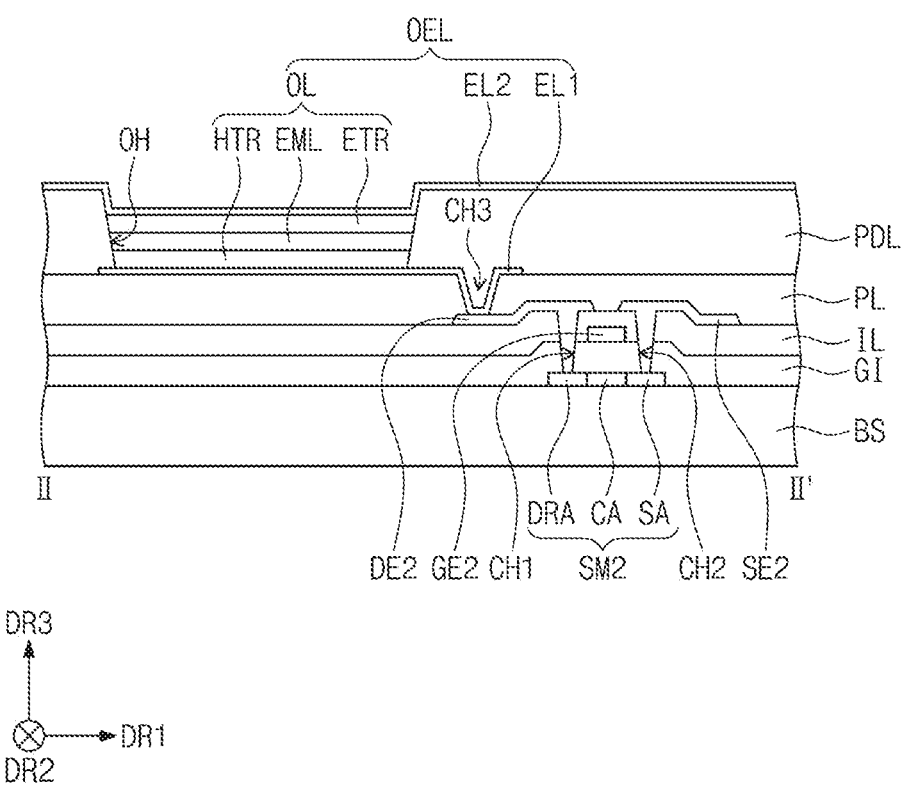
FIG. 6 is a cross-sectional view taken along a region II-II' of FIG. 5.

FIG. 4 is a circuit diagram of a pixel among pixels included in an organic electroluminescent display device according to an exemplary embodiment of the inventive concept. FIG. 5 is a plan view showing a pixel among pixels included in an organic electroluminescent display device according to an exemplary embodiment of the inventive concept. FIG. 6 is a cross-sectional view taken along a region II-II' of FIG. 5.

Referring to FIGS. 4 to 6, a pixel PX may be connected with a wire part including a gate line GL, a data line DL and a driving voltage line DVL. The pixel PX includes thin film transistors TFT1 and TFT2 connected to the wire part, and an organic electroluminescent device OEL connected to the thin film transistors TFT1 and TFT2, and a capacitor Cst.

The gate line GL is extended in a first direction DR1. The data line DL is extended in a second direction DR2 which crosses the gate line GL. The driving voltage line DVL is extended in substantially the same direction as the data line DL, that is, in the second direction DR2. The gate line GL delivers scanning signals to the thin film transistors TFT1 and TFT2, the data line DL delivers data signals to the thin film transistors TFT1 and TFT2, and the driving voltage line DVL provides the thin film transistors TFT1 and TFT2 with a driving voltage.

The thin film transistors TFT1 and TFT2 may include a driving thin film transistor TFT2 for controlling the organic electroluminescent device OEL and a switching thin film transistor TFT1 for switching the driving thin film transistor TFT2. In an exemplary embodiment of the inventive concept, a case where a pixel PX includes two thin film transistors TFT1 and TFT2 is explained. However, exemplary embodiments of the inventive concepts are not limited thereto. The pixel PX may include one thin film transistor and one capacitor, or the pixel PX may be provided with at least three thin film transistors and at least two capacitors.

The switching thin film transistor TFT1 includes a first gate electrode GE1, a first source electrode SE1 and a first drain electrode DE1. The first gate electrode GE1 is connected with the gate line GL, and the first source electrode SE1 is connected with the data line DL. The first drain electrode DE1 is connected with a first common electrode CE1 by a fifth contact hole CH5. The switching thin film transistor TFT1 delivers data signals applied to the data line DL to the driving thin film transistor TFT2 according to scanning signals applied to the gate line GL.

The driving thin film transistor TFT2 includes a second gate electrode GE2, a second source electrode SE2 and a second drain electrode DE2. The second gate electrode GE2 is connected with the first common electrode CE1. The second source electrode SE2 is connected with the driving voltage line DVL. The second drain electrode DE2 is connected with the first electrode EL1 by a third contact hole CH3.

The capacitor Cst is connected between the second gate electrode GE2 and the second source electrode SE2 of the driving thin film transistor TFT2 and charges and maintains data signals inputted to the second gate electrode GE2 of the driving thin film transistor TFT2. The capacitor Cst may include a first common electrode CE1 which is connected with the first drain electrode DE1 by a sixth contact hole CH6 and a second common electrode CE2 which is connected with the driving voltage line DVL.

The organic electroluminescent display device (DD of FIG. 3) according to an exemplary embodiment of the inventive concept may include a base substrate BS on which thin film transistors TFT1 and TFT2 and an organic electroluminescent device OEL are laminated. The base substrate BS may be formed using any material commonly used without specific limitation, and may be formed using an insulating material, for example, glass, plastics, quartz, etc. Organic polymers forming the base substrate BS may include polyethylene terephthalate (PET), polyethylene naphthalate (PEN), polyimide, polyether sulfone, etc. The base substrate BS may be selected in consideration of mechanical strength, thermal stability, transparency, surface smoothness, availability of handling, water resistance, etc.

On the base substrate BS, a substrate buffer layer (not shown) may be disposed. The substrate buffer layer (not shown) may prevent the diffusion of impurities into the switching thin film transistor TFT1 and the driving thin film transistor TFT2. The substrate buffer layer (not shown) may be formed using silicon nitride (SiNx), silicon oxide (SiOx), silicon oxynitride (SiOxNy), etc., and may be omitted according to the material of the base substrate BS and process conditions.

On the base substrate BS, a first semiconductor layer SM1 and a second semiconductor layer SM2 are disposed. The first semiconductor layer SM1 and the second semiconductor layer SM2 are formed using a semiconductor material, and are operated as active layers of the switching thin film transistor TFT1 and the driving thin film transistor TFT2, respectively. Each of the first semiconductor layer SM1 and the second semiconductor layer SM2 includes a source area SA, a drain area DRA and a channel area CA disposed between the source area SA and the drain area DRA. Each of the first semiconductor layer SM1 and the second semiconductor layer SM2 may be selected and formed from an inorganic semiconductor or an organic semiconductor. The source area SA and the drain area DRA may be doped with n-type impurities or p-type impurities.

On the first semiconductor layer SM1 and the second semiconductor layer SM2, a gate insulating layer GI is disposed. The gate insulating layer GI covers the first semiconductor layer SM1 and the second semiconductor layer SM2. The gate insulating layer GI may be formed using an organic insulating material or an inorganic insulating material.

On the gate insulating layer GI, a first gate electrode GE1 and a second gate electrode GE2 are disposed. Each of the first gate electrode GE1 and the second gate electrode GE2 is formed to cover the area corresponding to the channel area CA of each of the first semiconductor layer SM1 and the second semiconductor layer SM2.

On the first gate electrode GE1 and the second gate electrode GE2, an insulating interlayer IL is disposed. The insulating interlayer IL covers the first gate electrode GE1 and the second gate electrode GE2. The insulating interlayer IL may be formed using an organic insulating material or an inorganic insulating material.

On the insulating interlayer IL, a first source electrode SE1, a first drain electrode DE1, a second source electrode SE2 and a second drain electrode DE2 are disposed. The second drain electrode DE2 makes contact with a drain area DRA of a second semiconductor layer SM2 by a first contact hole CH1 which is formed in the gate insulating layer GI and the insulating interlayer IL, and the second source electrode SE2 makes contact with a source area SA of the second semiconductor layer SM2 by a second contact hole CH2 which is formed in the gate insulating layer GI and the insulating interlayer IL. The first source electrode SE1 makes contact with a source area (not shown) of the first semiconductor layer SM1 by a fourth contact hole CH4 which is formed in the gate insulating layer GI and the insulating interlayer IL, and the first drain electrode DE1 makes contact with a drain area (not shown) of the first semiconductor layer SM1 by a fifth contact hole CH5 which is formed in the gate insulating layer GI and the insulating interlayer IL.

On the first source electrode SE1, the first drain electrode DE1, the second source electrode SE2, and the second drain electrode DE2, a passivation layer PL is disposed. The passivation layer PL may act as a protection layer protecting the switching thin film transistor TFT1 and the driving thin film transistor TFT2, or act as a planarization layer planarizing the top surface thereof.

On the passivation layer PL, an organic electroluminescent device OEL is disposed. The organic electroluminescent device OEL includes a first electrode EL1, a second electrode EL2 disposed on the first electrode EL1, and an organic layer OL including an emission layer EML which is disposed between the first electrode EL1 and the second electrode EL2.

Particularly, on the passivation layer PL, the first electrode EL1 is provided, and on the passivation layer PL and the first electrode EL1, a pixel defining layer PDL is provided. In the pixel defining layer PDL, an opening part OH exposing at least a portion of the top surface of the first electrode EL1 is defined. The pixel defining layer PDL may partition the organic electroluminescent device OEL so as to correspond to each of the pixels PX.

The pixel defining layer PDL may be formed using a polymer resin. For example, the pixel defining layer PDL may be formed by including a polyacrylate-based resin or a polyimide-based resin. In addition, the pixel defining layer PDL may be formed by further including an inorganic material in addition to the polymer resin. Meanwhile, the pixel defining layer PDL may be formed by including a light absorbing material, or may be formed by including a black pigment or a black dye. The pixel defining layer PDL formed by including the black pigment or the black dye may accomplish a black pixel defining layer. During forming the pixel defining layer PDL, carbon black may be used as the black pigment or the black dye, but exemplary embodiments of the inventive concepts are not limited thereto.

In addition, the pixel defining layer PDL may be formed using an inorganic material. For example, the pixel defining layer PDL may be formed by including silicon nitride ($SiN_x$), silicon oxide ($SiO_x$), silicon oxynitride ($SiO_xN_y$), etc.

On the pixel defining layer PDL and the first electrode EL1, an organic layer OL and a second electrode EL2 are laminated one by one. The organic layer OL includes a hole transport region HTR, an emission layer EML, and an electron transport region ETR. Explanation on the first electrode EL1, the hole transport region HTR, the electron transport region ETR and the second electrode EL2 is the same as described above, and will be omitted.

Figure 7:
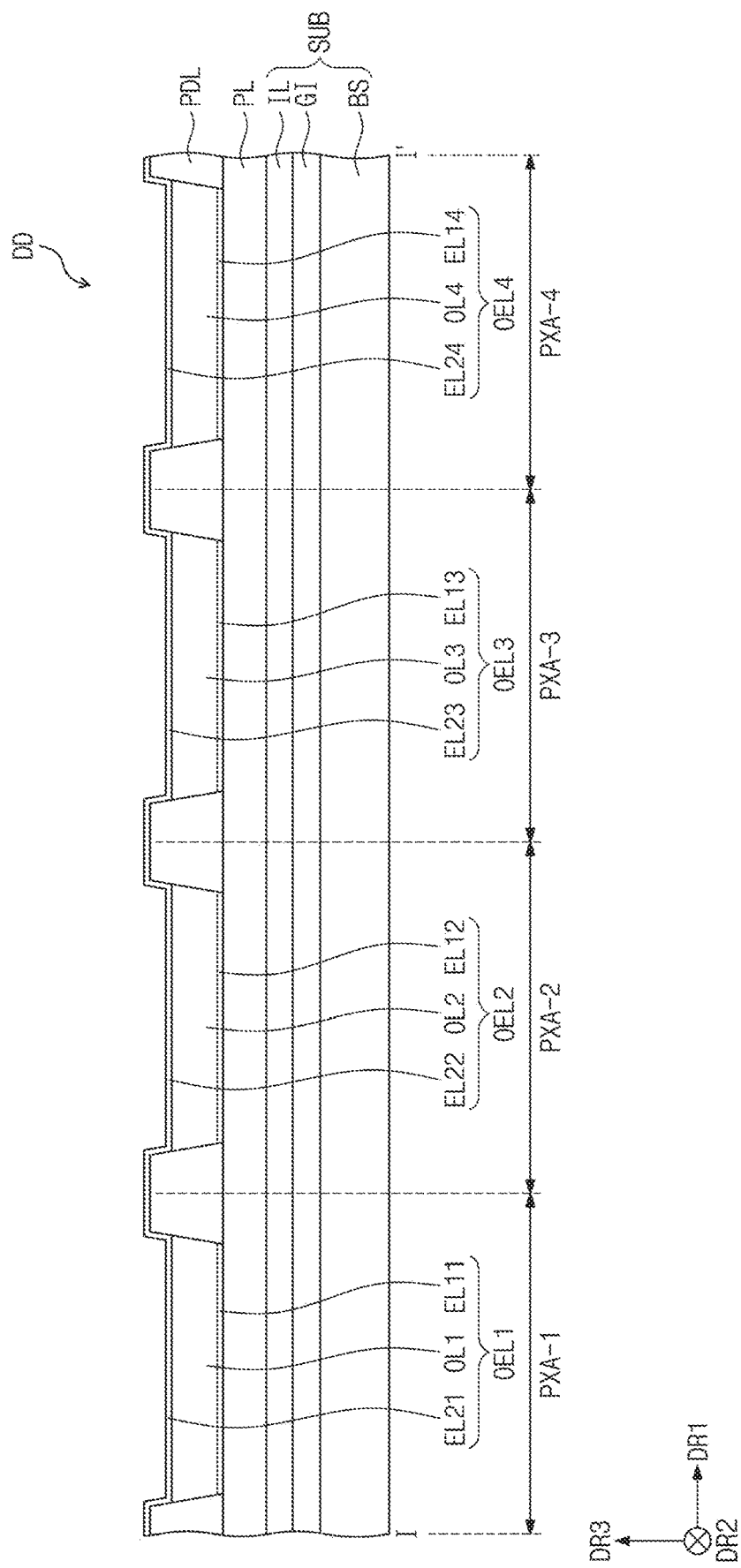
FIG. 7 is a cross-sectional view taken along a region I-I' of FIG. 3.

FIG. 7 is a cross-sectional view taken along a region I-I' of FIG. 3.

Referring to FIG. 7, an organic electroluminescent display device DD of the inventive concept may include a plurality of pixel areas PXA-1, PXA-2, PXA-3 and PXA-4. For example, a first pixel area PXA-1, a second pixel area PXA-2, a third pixel area PXA-3 and a fourth pixel area PXA-4, which emit lights in different wavelength regions, may be included. In an exemplary embodiment shown in FIG. 7, the first pixel area PXA-1 may be a blue pixel area, the second pixel area PXA-2 may be a green pixel area, the third pixel area PXA-3 may be a red pixel area, and the fourth pixel area PXA-4 may be a near-infrared pixel area. That is, in an exemplary embodiment, the organic electroluminescent display device DD may include a blue pixel area, a green pixel area, a red pixel area, and a near-infrared pixel area. For example, the blue pixel area is a blue light-emitting area which emits blue light, the green pixel area and the red pixel area represent a green light-emitting area and a red light-emitting area, respectively, and the near-infrared pixel area is an area emitting near-infrared rays in a wavelength region of about 750 nm to about 1,000 nm. Meanwhile, the pixel areas PXA-1, PXA-2, PXA-3 and PXA-4 may be light-emitting areas corresponding to the plurality of pixels PX1, PX2, PX3 and PX4, respectively, in the explanation referring to FIG. 3.

The first pixel area PXA-1 may be an area in which a first organic electroluminescent device OEL1 having a first organic layer OL1 which emits first visible rays is disposed. The second pixel area PXA-2 and the third pixel area PXA-3 may be areas in which a second organic electroluminescent device OEL2 which emits second visible rays and a third organic electroluminescent device OEL3 which emits third visible rays are disposed, respectively. The fourth pixel area PX-4 may be an area in which a fourth organic electroluminescent device OEL4 which emits near-infrared rays is disposed. The first visible rays, the second visible rays and the third visible rays may have different wavelength regions. However, exemplary embodiments of the inventive concepts are not limited thereto. They may have the same wavelength region, or two of the first visible rays, the second visible rays and the third visible rays may have the same wavelength region and the remaining one may have a different wavelength region.

The first pixel area PXA-1, the second pixel area PXA-2 and the third pixel area PXA-3 may be areas in which pixels achieving images are disposed, and the fourth pixel area PXA-4 may be an area in which a pixel other than the pixels achieving images, is disposed.

For example, the first organic electroluminescent device OEL1 may include a first electrode EL11, a first organic layer OL1 and a second electrode EL21. Meanwhile, even though not shown, the first organic layer OL1 may include a hole transport region, an emission layer and an electron transport region. For example, the first organic layer OL1 may include an emission layer emitting blue light, and a luminescent material may be selected from materials known as blue light-emitting materials, without limitation. The second organic electroluminescent device OEL2 may include a first electrode EL12, a second organic layer OL2 and a second electrode EL22, and the third organic electroluminescent device OEL3 may include a first electrode EL13, a third organic layer OL3 and a second electrode EL23. The second organic layer OL2 and the third organic layer OL3 may include emission layers emitting green light and red light, respectively, and luminescent materials may be selected from materials known as green light-emitting materials and red light-emitting materials, without limitation.

Meanwhile, the fourth organic electroluminescent device OEL4 may correspond to the organic electroluminescent device (for example, 10 of FIG. 1) according to an exemplary embodiment of the inventive concept. Particularly, the fourth organic electroluminescent device OEL4 may include an emission layer emitting near-infrared rays. The fourth organic electroluminescent device OEL4 includes a first electrode EL14, a fourth organic layer OL4 and a second electrode EL24, and the fourth organic layer OL4 may include an emission layer emitting near-infrared rays.

Referring to FIG. 3 again, each of the first pixel PX1, the second pixel PX2, the third pixel PX3 and the fourth pixel PX4 may be provided in plural.

FIG. 3 illustrates the first pixel PX1, the second pixel PX2, the third pixel PX3 and the fourth pixel PX4 arranged in the first direction. However, exemplary embodiments of the inventive concepts are not limited thereto. In addition, FIG. 3 illustrates the first pixel PX1, the second pixel PX2, the third pixel PX3 and the fourth pixel PX4 having the same size. However, exemplary embodiments of the inventive concepts are not limited thereto.

Figure 8:
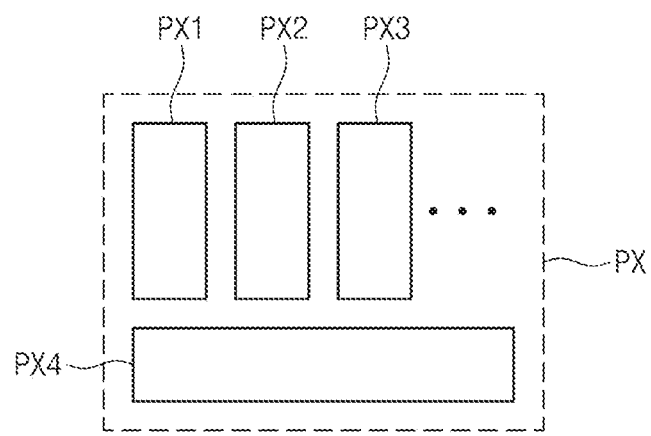
FIG. 8 is a plan view illustrating the relation of a pixel layout of an organic electroluminescent display device according to an exemplary embodiment of the inventive concept.
Figure 9:
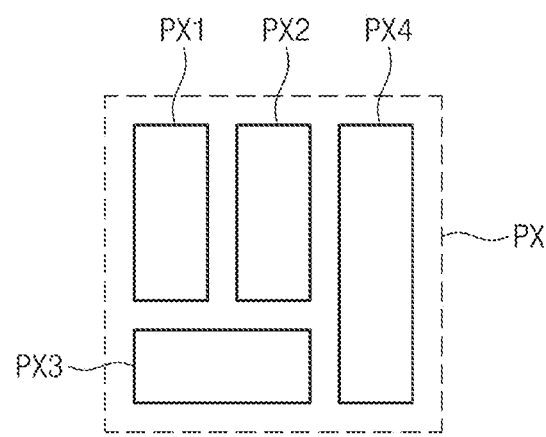
FIG. 9 is a plan view illustrating the relation of a pixel layout of an organic electroluminescent display device according to an exemplary embodiment of the inventive concept.

FIG. 8 is a plan view illustrating the relation of a pixel layout of an organic electroluminescent display device according to an exemplary embodiment of the inventive concept. FIG. 9 is a plan view illustrating the relation of a pixel layout of an organic electroluminescent display device according to an exemplary embodiment of the inventive concept.

Referring to FIGS. 8 and 9, at least one of a first pixel PX1, a second pixel PX2, a third pixel PX3 or a fourth pixel PX4 may have a different size. In addition, at least one of the first pixel PX1, the second pixel PX2, the third pixel PX3 or the fourth pixel PX4 may be extended in a different direction or may be arranged in a different direction.

The organic electroluminescent display device according to an exemplary embodiment of the inventive concept includes a pixel emitting near-infrared rays in a display area, and the pixel may be utilized as a pixel achieving sensing function using near-infrared rays. Accordingly, a configuration of sensing function such as fingerprint recognition and iris recognition may be disposed in a display area, thereby decreasing the dimension of a non-display area.

Hereinafter, the organometallic compound according to an exemplary embodiment of the inventive concept will be explained.

The organometallic compound according to an exemplary embodiment of the inventive concept may be used as a material for an emission layer in the organic electroluminescent device according to an exemplary embodiment of the inventive concept. In addition, the organometallic compound according to an exemplary embodiment of the inventive concept may be used as a material for an emission layer in a fourth organic electroluminescent device included in the above-described organic electroluminescent display device according to an exemplary embodiment of the inventive concept.

In the present disclosure, ——— means a part to be connected, for example, a coordination bond.

In the present disclosure, "substituted or unsubstituted" may mean substituted with at least one substituent selected from the group consisting of a deuterium atom, an alkyl group, an alkenyl group, a heterocycle, and an aryl group, or unsubstituted. In addition, each of the substituents illustrated above may be substituted or unsubstituted. For example, a biphenyl group may be interpreted as an aryl group, or a phenyl group substituted with a phenyl group.

In the present disclosure, "combining each other to form a ring" may mean combining each other to form a substituted or unsubstituted hydrocarbon ring, or a substituted or unsubstituted heterocycle. In addition, a ring formed by the combination with an adjacent group may be connected with other ring to form a spiro structure.

In the present disclosure, the hydrocarbon ring may include an aliphatic hydrocarbon ring and an aromatic hydrocarbon ring (aryl group). A heterocycle includes an aliphatic heterocycle and an aromatic heterocycle (heteroaryl group). The hydrocarbon ring and the heterocycle may be a monocycle or polycycle.

In the present disclosure, "adjacent group" may mean a substituent substituted for an atom which is directly bonded to an atom for which a corresponding substituent is substituted, another substituent which is substituted for an atom for which a corresponding substituent is substituted, or a substituent which is sterically the closest to a corresponding substituent. For example, two methyl groups in 1,2-dimethylbenzene may be interpreted as "adjacent groups" to each other, and two ethyl groups in 1,1-diethylcyclopentene may be interpreted as "adjacent groups" to each other.

In the present disclosure, alkyl may have a linear or branched chain or a cycle shape. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, alkenyl may be linear or branched. The carbon number of the alkenyl is not specifically limited, and may be 2 to 30, 2 to 20, or 2 to 10. Examples of the alkenyl may include vinyl, 1-butenyl, 1-pentenyl, 1,3-butadienyl aryl, styrenyl, styrylvinyl, etc., without limitation.

In the present disclosure, aryl means an optional functional group or substituent derived from an aromatic hydrocarbon ring. The aryl may be monocyclic aryl or polycyclic aryl. The carbon number of the aryl for forming a ring may be 6 to 60, 6 to 30, 6 to 20, or 6 to 15. Examples of the aryl may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc., without limitation.

In the present disclosure, fluorenyl may be substituted, or two substituents may be combined with each other to form a spiro structure. Examples of the substituted fluorenyl are as follows. However, exemplary embodiments of the inventive concepts are not limited thereto.

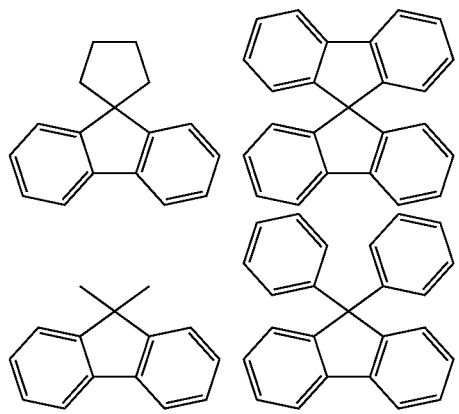

In the present disclosure, heteroaryl may be heteroaryl including at least one of O, N, P, Si or S as a heteroatom. If the heteroaryl includes two heteroatoms, two heteroatoms may be the same or different from each other. The carbon number of the heteroaryl for forming a ring may be 2 to 30 or 2 to 20. The heteroaryl may be monocyclic heteroaryl or polycyclic heteroaryl. The polycyclic heteroaryl may have a structure of, for example, two rings or three rings. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In the present disclosure, a direct linkage may include a single bond.

The organometallic compound according to an exemplary embodiment of the inventive concept is represented by the following Formula 1:

[Formula 1]

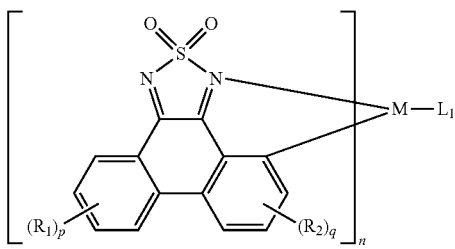

In Formula 1, $R_1$ and $R_2$ are each independently a hydrogen atom, a deuterium atom, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a ring, "p" is an integer of 0 to 4, "q" is an integer of 0 to 3, "n" is 1 or 2, M is Pt, Ir or Os, and $L_1$ is a bidentate ligand (divalent organic ligand).

If "p" is 2 or more, a plurality of $R_1$ groups are the same or different, and if "q" is 2 or more, a plurality of $R_2$ groups are the same or different. If "p" is 1, $R_1$ may be a substituent other than a hydrogen atom, and if "q" is 1, $R_2$ may be a substituent other than a hydrogen atom.

As described above, if $R_1$ and/or $R_2$ are in plural, they may be combined with an adjacent group to form a ring. In this case, Formula 1 may be more conjugated, and long wavelength may be emitted.

Formula 1 may be represented by one of Formulae 1-1 to 1-3 below. However, Formulae 1-1 to 1-3 are only illustrations, and an exemplary embodiment of the inventive concept is not limited thereto.

[Formula 1-1]

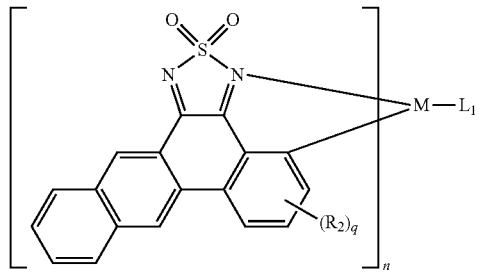

[Formula 1-2]

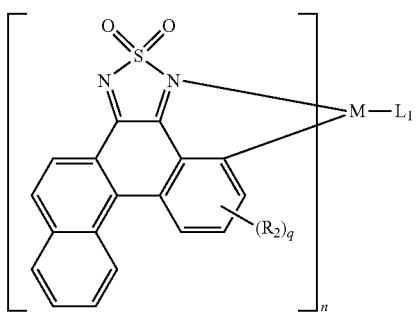

[Formula 1-3]

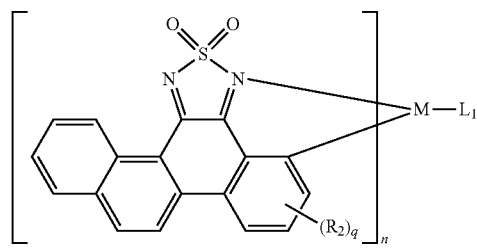

In Formulae 1-1 to 1-3, M, $L_1$, $R_2$, "n" and "q" are the same as described above.

In Formulae 1-1 to 1-3, a naphthalene ring may be substituted with one or more substituents.

$L_1$ is not specifically limited only if a bidentate ligand (divalent organic ligand), and may be, for example, represented by one of the following Formulae 2-1 to 2-6:

[Formula 2-1]

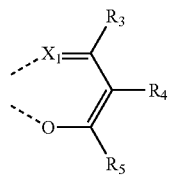

[Formula 2-2]

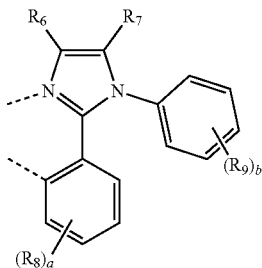

[Formula 2-3]

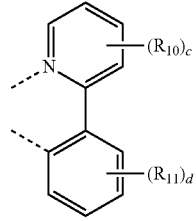

[Formula 2-4]

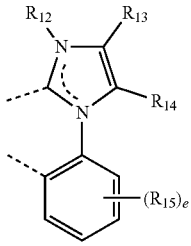

21
-continued

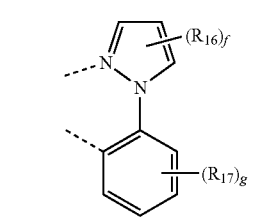
[Formula 2-5]

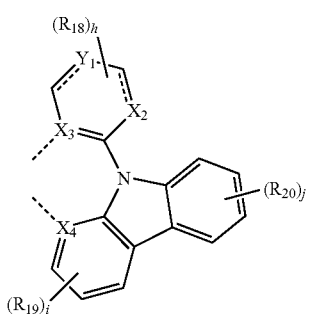
[Formula 2-6]

In Formula 2-1, $X_1$ is O or NR', $R_3$ to $R_5$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring.

In Formula 2-2, $R_6$ to $R_9$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, "a" is an integer of 0 to 4, and "b" is an integer of 0 to 5.

In Formula 2-2, if "a" is 2 or more, a plurality of $R_8$ groups are the same or different, and if "b" is 2 or more, a plurality of $R_9$ groups are the same or different. In Formula 2-2, if "a" is 1, $R_8$ group may be a substituent other than a hydrogen atom, and if "q" is 1, $R_9$ may be a substituent other than a hydrogen atom.

In Formula 2-3, $R_{10}$ and $R_{11}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, and "c" and "d" are each independently an integer of 0 to 4.

In Formula 2-3, if "c" is 2 or more, a plurality of $R_{10}$ groups are the same or different, and if "d" is 2 or more, a plurality of $R_{11}$ groups are the same or different. In Formula 2-3, if "c" is 1, $R_{10}$ may be a substituent other than a hydrogen atom, and if "d" is 1, $R_{11}$ may be a substituent other than a hydrogen atom.

In Formula 2-4, $R_{12}$ to $R_{15}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, and "e" is an integer of 0 to 4.

In Formula 2-4, if "e" is 2 or more, a plurality of $R_{15}$ groups are the same or different, and if "e" is 1, $R_{15}$ may be a substituent other than a hydrogen atom.

22

In Formulae 2-5, $R_{16}$ and $R_{17}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, "f" is an integer of 0 to 3, and "g" is an integer of 0 to 4.

In Formula 2-5, if "f" is 2 or more, a plurality of $R_{16}$ groups are the same or different, and if "g" is 2 or more, a plurality of $R_{17}$ groups are the same or different. In Formula 2-5, if "f" is 1, $R_{16}$ may be a substituent other than a hydrogen atom, and if "g" is 1, $R_{17}$ may be a substituent other than a hydrogen atom.

In Formula 2-6, $X_2$ to $X_4$ are each independently CH, N, or $NR_{21}$, $Y_1$ is a direct linkage or CH, $R_{18}$ to $R_{21}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or may be combined with an adjacent group to form a ring, "h" is an integer of 0 to 2, "i" is an integer of 0 to 3, and "j" is an integer of 0 to 4.

In Formula 2-6, if $Y_1$ is a direct linkage, a ring including $X_2$ and $X_3$ is a five-member ring.

In Formulae 2-6, if "h" is 2 or more, a plurality of $R_{18}$ groups are the same or different, if "i" is 2 or more, a plurality of $R_{19}$ groups are the same or different, if "j" is 2 or more, a plurality of $R_{20}$ groups are the same or different. In Formula 2-6, if "h" is 1, $R_{18}$ may be a substituent other than a hydrogen atom, if "i" is 1, $R_{19}$ may be a substituent other than a hydrogen atom, and if "j" is 1, $R_{20}$ may be a substituent other than a hydrogen atom.

Formula 2-1 may be, for example, represented by one of the following Formulae 3-1 to 3-3:

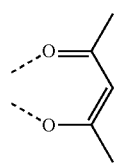
[Formula 3-1]

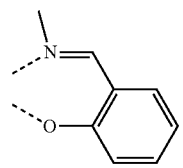
[Formula 3-2]

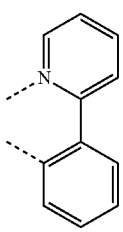
[Formula 3-3]

In Formulae 3-2 and 3-3, the benzene ring may be substituted with one or more substituents.

An exemplary embodiment of the inventive concept is not limited thereto, but $L_1$ is preferably represented by one of Formulae 3-1 to 3-3.

Formula 2-2 may be, for example, represented by one of Formulae 2-2-1 to 2-2-3. However, exemplary embodiments of the inventive concepts are not limited thereto.

[Formula 2-2-1]

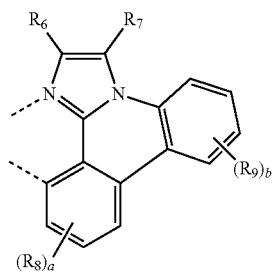

[Formula 2-2-2]

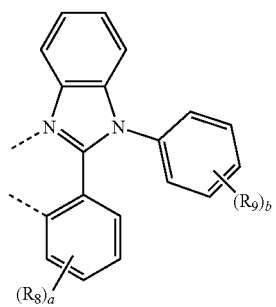

[Formula 2-2-3]

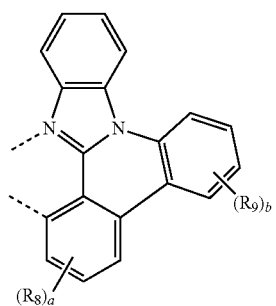

In Formulae 2-2-1 to 2-2-3, $R_6$ to $R_9$, "a" and "b" are the same as described above.

In Formulae 2-2-2 and 2-2-3, the benzene ring of a benzoimidazole may be substituted with one or more substituents.

Formula 2-3 may be, for example, represented by one of Formulae 2-3-1 to 2-3-4. However, exemplary embodiments of the inventive concepts are not limited thereto.

[Formula 2-3-1]

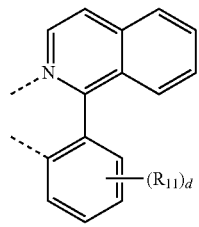

[Formula 2-3-2]

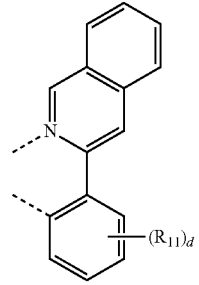

[Formula 2-3-3]

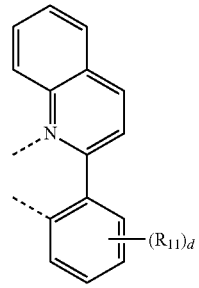

[Formula 2-3-4]

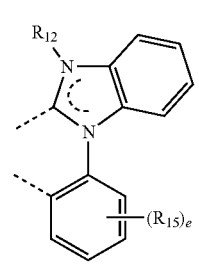

In Formulae 2-3-1 to 2-3-4, $X_5$ is O, S or NR", R" is a hydrogen atom, a deuterium atom, an alkyl group or an aryl group, and $R_{10}$, $R_{11}$, "c" and "d" are the same as described above.

In Formulae 2-3-2 to 2-3-4, the benzene ring of isoquinoline may be substituted with one or more substituents.

Formula 2-4 may be, for example, represented by Formula 2-4-1 or 2-4-2. However, exemplary embodiments of the inventive concepts are not limited thereto.

[Formula 2-4-1]

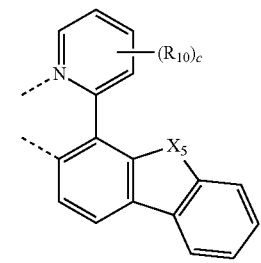

[Formula 2-4-2]

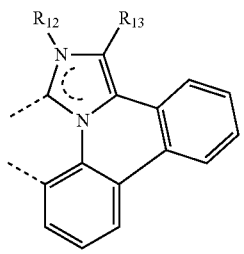

In Formulae 2-4-1 and 2-4-2, $R_{12}$, $R_{13}$, $R_{15}$ and "e" are the same as described above.

In Formulae 2-4-1 and 2-4-2, the benzene ring may be substituted with one or more substituents.

Formula 2-5 may be, for example, represented by Formula 2-5-1. However, exemplary embodiments of the inventive concepts are not limited thereto.

[Formula 2-5-1]

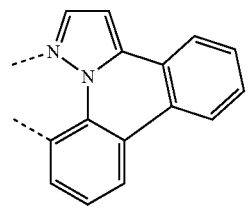

The structure represented by Formula 2-5-1 may be substituted with one or more substituents.

Formula 2-6 may be, for example, represented by one of Formulae 2-6-1 to 2-6-3. However, exemplary embodiments of the inventive concepts are not limited thereto.

[Formula 2-6-1]

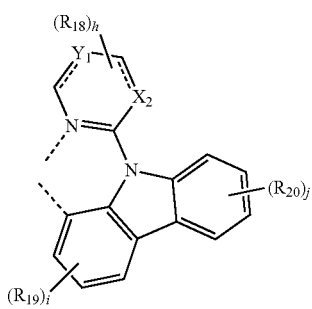

[Formula 2-6-2]

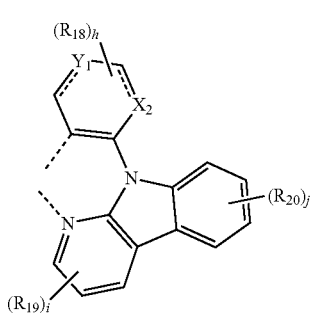

[Formula 2-6-3]

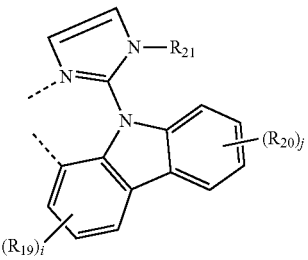

In Formulae 2-6-1 to 2-6-3, $R_{18}$ to $R_{21}$, "h", "i" and "j" are the same as described above.

In Formula 2-6-3, the imidazole ring may be substituted with one or more substituents.

Exemplary embodiments of the inventive concepts are not limited thereto, but in Formula 1, M is preferably Pt.

In Formula 1, M is Pt, and $L_1$ may be represented by one of the above Formulae 3-1 to 3-3.

In Formula 1, each of "p" and "q" may be 0. Exemplary embodiments of the inventive concepts are not limited thereto, but at least one of "p" or "q" may be 1 or more, and at least one of $R_1$ or $R_2$ may be a methyl group, an ethyl group, a propyl group, a butyl group, a carbazole group, or a phenyl group. For example, at least one of $R_1$ or $R_2$ may be a t-butyl group, a carbazole group, or a phenyl group.

The organometallic compound represented by Formula 1 according to an exemplary embodiment of the inventive concept may be one selected from the compounds represented in Compound Group 1. However, exemplary embodiments of the inventive concepts are not limited thereto.

[Compound Group 1]

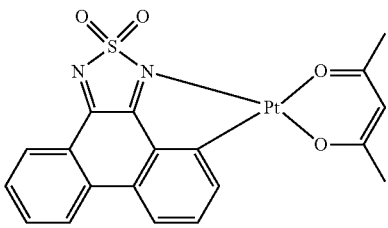

1

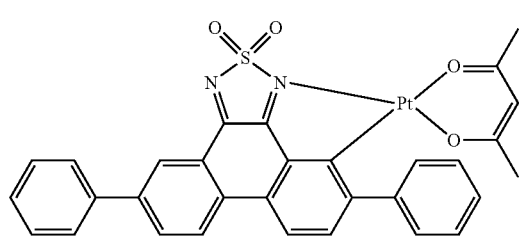

2

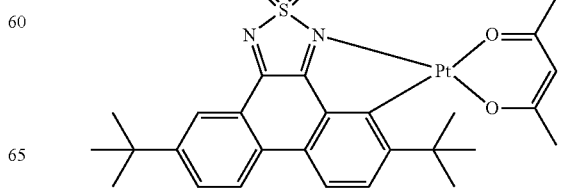

3

4
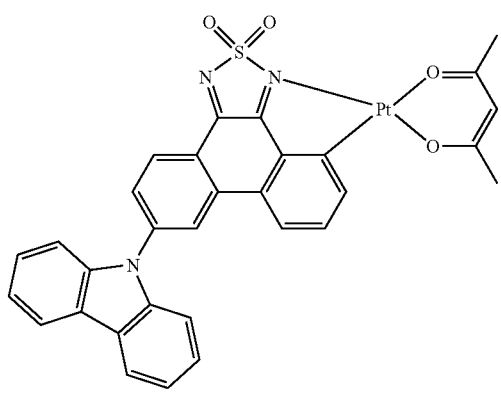
5
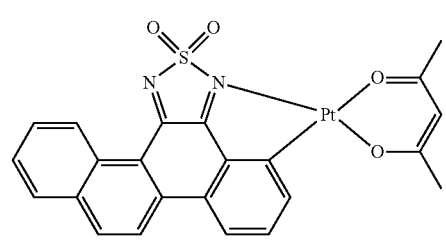
6
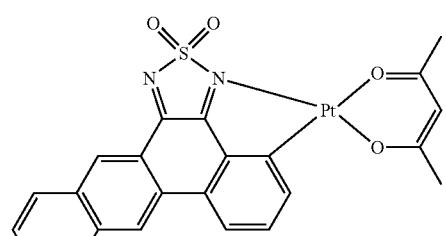
7
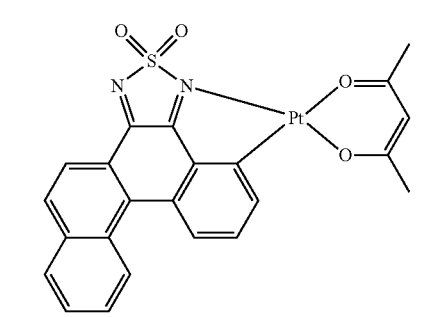
8
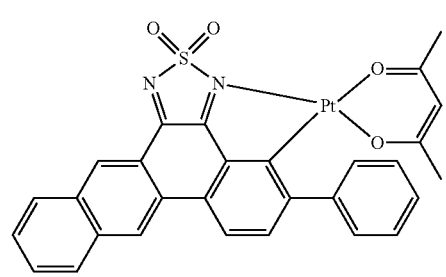
9
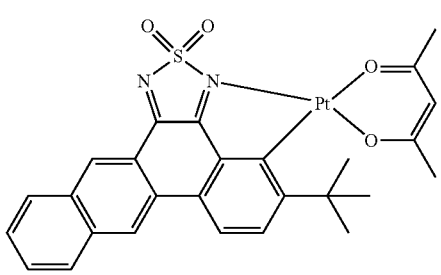
10
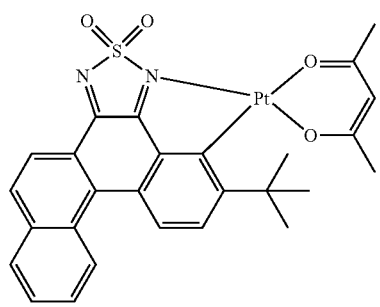
11
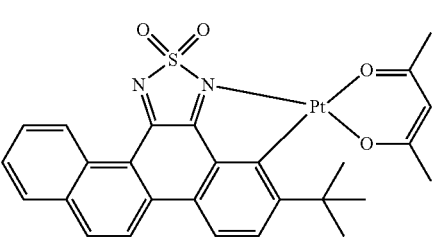
12
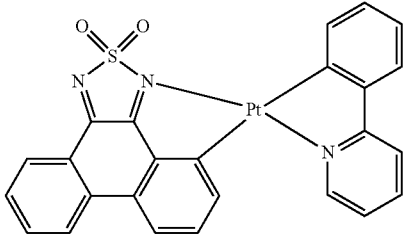
13
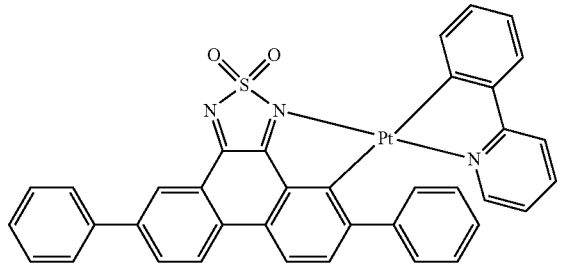
14
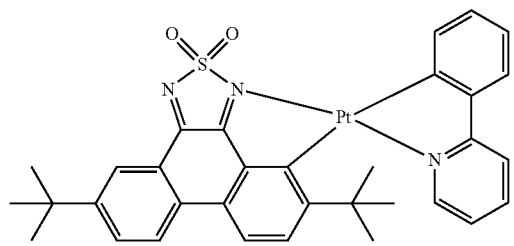

15
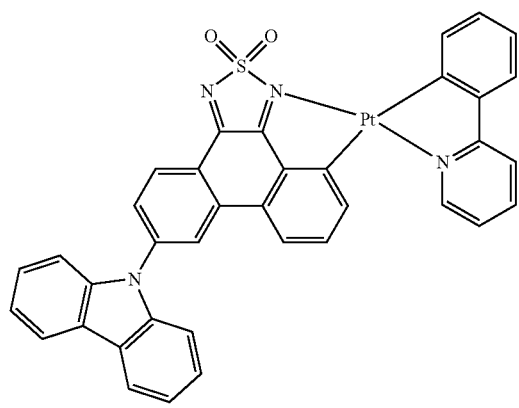
16
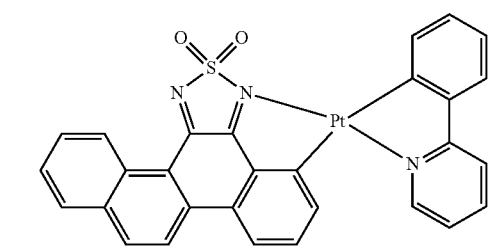
17
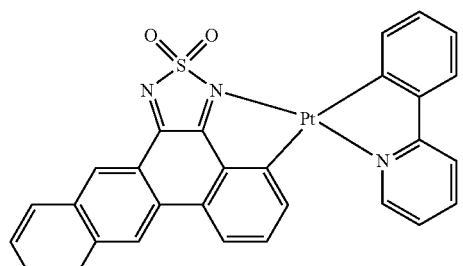
18
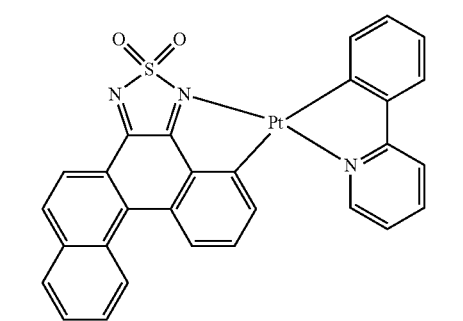
19
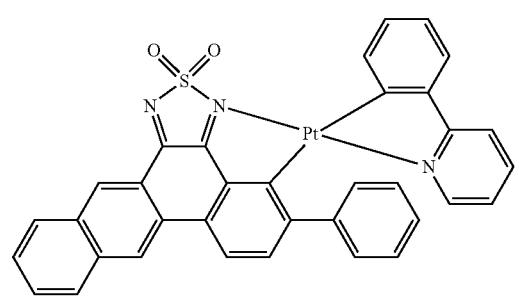
20
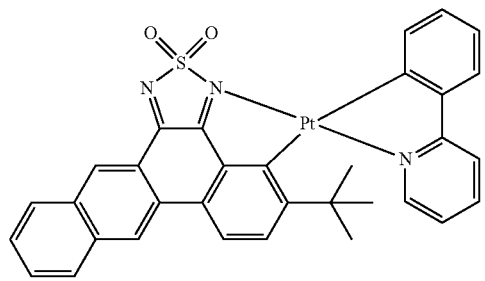
21
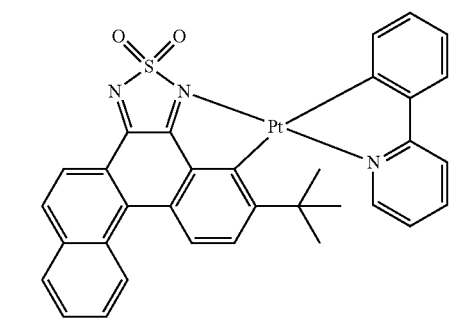
22
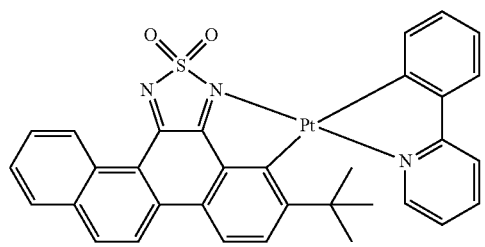
23
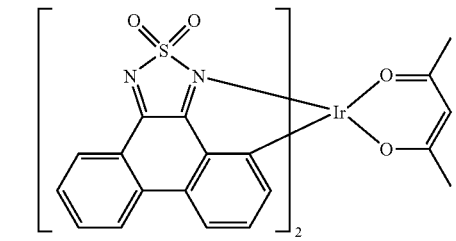
24
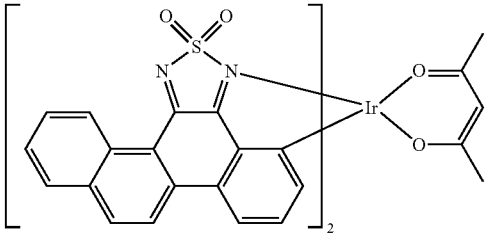
25
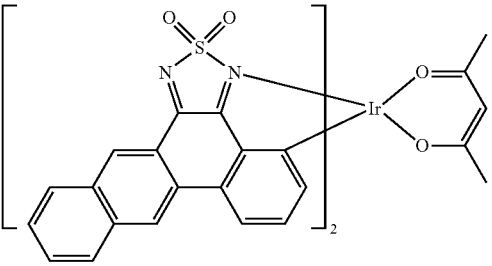

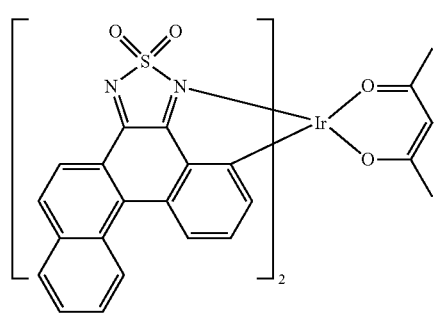

26

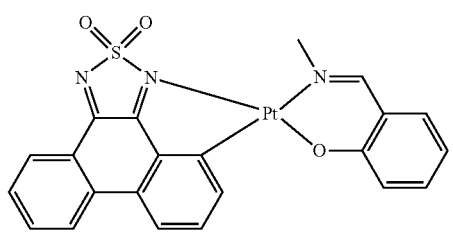

27

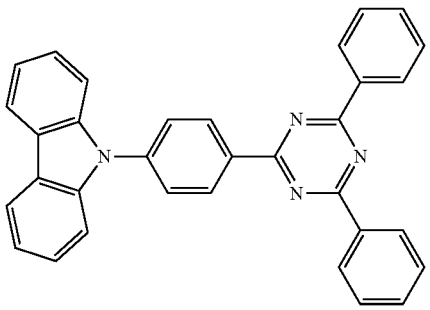

H-1

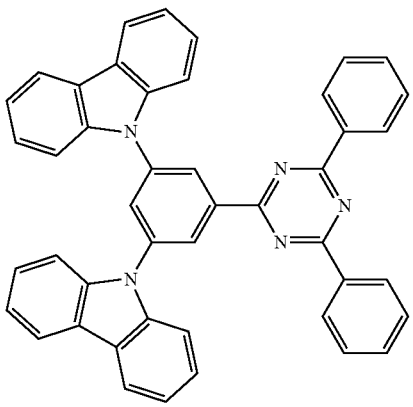

H-2

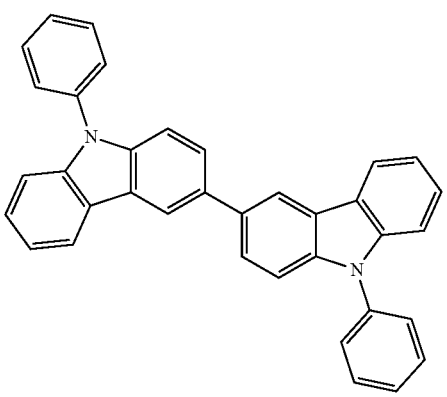

H-3

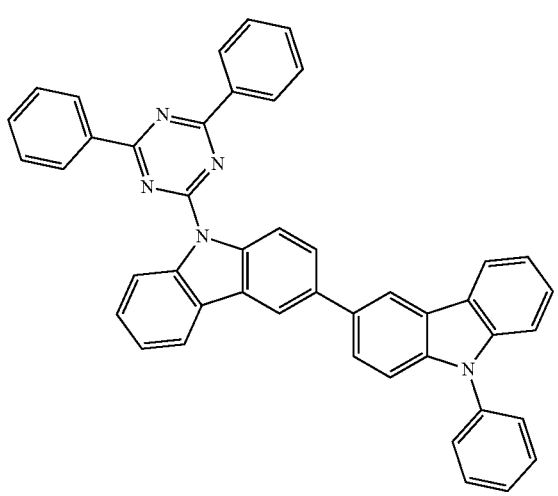

H-4

The organometallic compound according to an exemplary embodiment of the inventive concept is characterized in including an oxidated thiadiazole structure, and thus, may be used as a luminescent material of near-infrared rays. For example, the organometallic compound according to an exemplary embodiment of the inventive concept may be used as a luminescent material emitting near-infrared rays in a wavelength region of about 750 nm to about 1,000 nm.

Referring to FIGS. 1 and 2 again, the emission layer EML included in the organic electroluminescent device 10 according to an exemplary embodiment of the inventive concept will be explained in more particularly. The emission layer EML described below corresponds to an emission layer included in the fourth organic electroluminescent device OEL4 of the organic electroluminescent display device (DD in FIG. 7) according to an exemplary embodiment of the inventive concept.

The emission layer EML may include one or two or more kinds of the organometallic compound represented by Formula 1. The emission layer EML may further include a known material in addition to the organometallic compound represented by Formula 1.

The emission layer EML includes a host and a dopant, and the dopant may include the organometallic compound represented by Formula 1 according to an exemplary embodiment of the inventive concept. The emission layer EML uses the organometallic compound represented by Formula 1 according to an exemplary embodiment of the inventive concept and may be an emission layer emitting near-infrared rays.

Commonly used materials are not specifically limited as the host. Among a red host, a green host and a blue host, the red host is more preferable. The host may include at least one of Compound H-1 to H-15, without limitation.

-continued
H-5
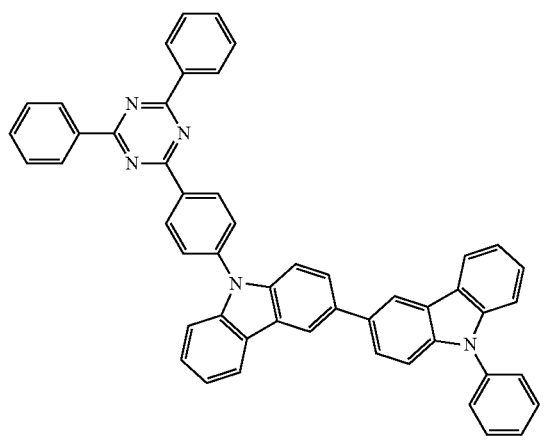
H-6
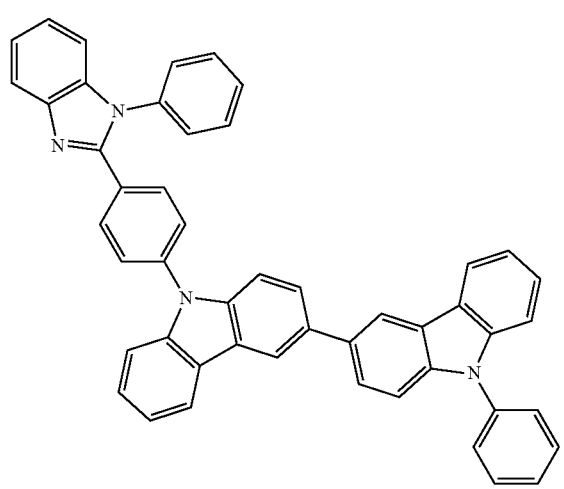
H-7
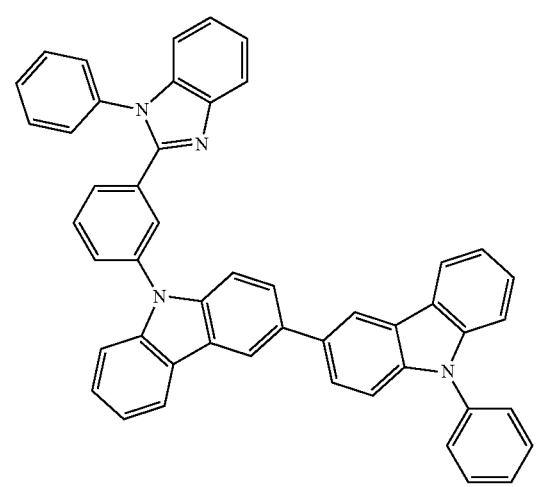
-continued
H-8
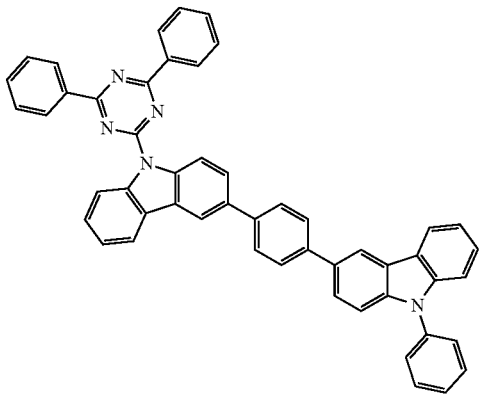
H-9
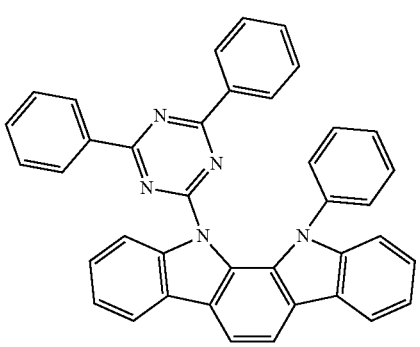
H-10
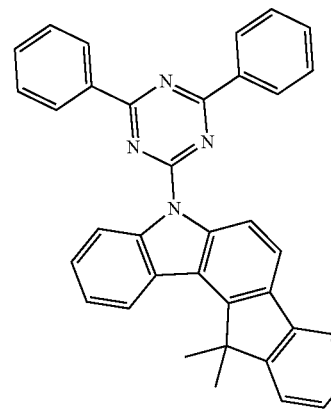
H-11
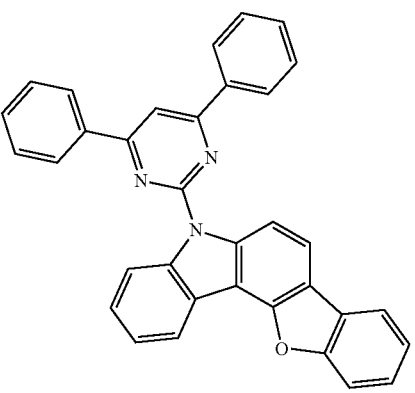

H-12

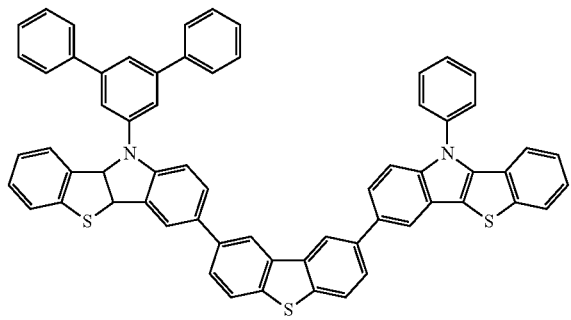

H-15

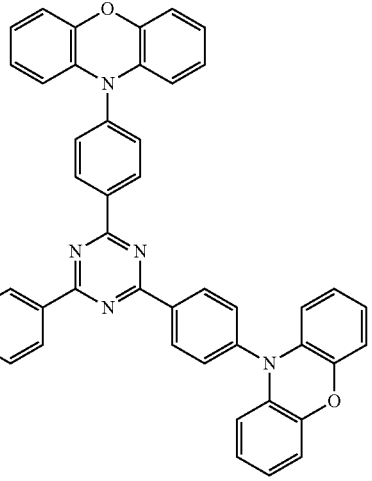

H-13

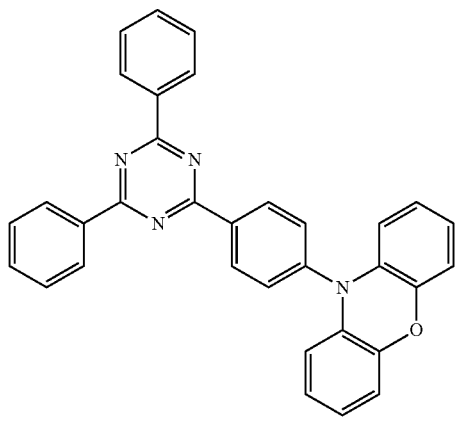

H-14

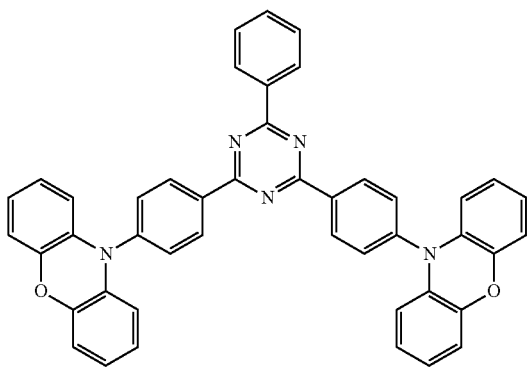

The organometallic compound according to an exemplary embodiment of the inventive concept may be used as a luminescent material of an organic electroluminescent device and an organic electroluminescent display device, and more particularly, as a luminescent material of near-infrared rays. The organic electroluminescent device and the organic electroluminescent display device including the organometallic compound according to an exemplary embodiment of the inventive concept may favorably accomplish high efficiency.

The organometallic compound represented by Formula 1 may be prepared based on the synthetic examples described below. However, the synthetic process of the organometallic compound represented by Formula 1 is not limited to the synthetic examples described below, and any reaction conditions known in the art may be applied.

Hereinafter, the inventive concept will be explained more particularly referring to preferred embodiments. The following embodiments are only for illustration to assist the understanding of the inventive concept, and the scope of the inventive concept is not limited thereto.

Synthetic Examples

The organometallic compound according to an exemplary embodiment of the inventive concept may be synthesized, for example, as follows. However, the synthetic method of the organometallic compound according to exemplary embodiments of the inventive concepts are not limited thereto.

1. Synthesis of Compound 1

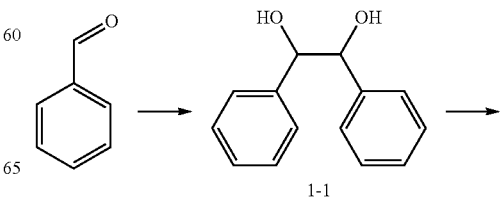

1-1

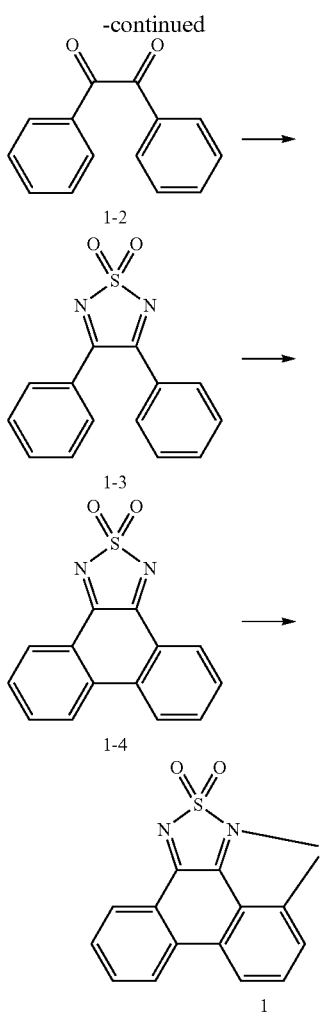

Synthesis of Compound 1-1

Under conditions of about −78° C. and a $N_2$ gas atmosphere, bis(cyclopentadienyl)titanium(IV) dichloride ($Cp_2TiCl_2$) (1.2 eq) was dissolved in THF, and sec-butylmagnesium chloride (sec-BuMgCl) (1.2 eq, 2.0 M in ethyl ether) was slowly added thereto. The resultant mixture was stirred at about −78° C. for about 2 hours and at room temperature for about 30 minutes. To the resultant mixture, benzaldehyde (1 eq) was slowly injected and the reaction was finished. An organic layer extracted with methylene chloride (MC) was dried with $Na_2SO_4$, and solvents were removed. The crude product thus obtained was separated by column chromatography to obtain Compound 1-1 (yield: 86%). $^1$H NMR ($CDCl_3$, 600 MHz): 7.71-7.70 (2H, d), 7.68-7.67 (2H, d), 7.40-7.39 (2H, t), 7.37-7.34 (2H, t), 7.29-7.26 (2H, t), 5.78 (2H, s), 2.99 (2H, s).

Synthesis of Compound 1-2

Compound 1-1 (1 eq) and N-bromosuccinimide (2 eq) were dissolved in $CCl_4$. The resultant mixture was stirred and refluxed for about 5 hours and the mixture thus obtained was filtered and washed with an ethyl ether solvent. The solid compound thus obtained was extracted with MC, an organic layer was dried with $Na_2SO_4$, and solvents were removed. The crude product thus obtained was separated by column chromatography to obtain Compound 1-2 (yield: 52%). $^1$H NMR ($CDCl_3$, 600 MHz): δ 9.36-9.35 (2H, d), 8.04-8.02 (2H, d), 7.77-7.75 (2H, t), 7.66-7.63 (2H, t), 7.51-7.48 (2H, t).

Synthesis of Compound 1-3

Compound 1-2 (1 eq) and sulfamide (4.5 eq) were dissolved in an anhydrous ethanol solvent and stirred and refluxed for about 8 hours while passing HCl gas through the reaction mixture. After finishing the reaction, the resultant reaction product was extracted with MC, an organic layer was dried with $Na_2SO_4$, and solvents were removed. The crude product thus obtained was separated by column chromatography to obtain Compound 1-3 (yield: 39%). $^1$H NMR ($CDCl_3$, 600 MHz): δ 8.30-8.28 (2H, m), 8.00-7.98 (2H, d), 7.92-7.90 (2H, m), 7.24-7.15 (4H, m).

Synthesis of Compound 1-4

Under a nitrogen atmosphere, a solution in which Compound 1-3 (1 eq) was dissolved was maintained at about 0° C., and anhydrous aluminum chloride (4 eq) was injected thereto. The resultant mixture was stirred at room temperature for about 1 hour and washed with cold ice water, and then, was filtered. The solid thus obtained was completely dried in a desiccator to obtain Compound 1-4 (42%). $^1$H NMR ($CDCl_3$, 600 MHz): δ 8.00-7.98 (2H, d), 7.85-7.82 (2H, d), 7.24-7.15 (4H, m).

Synthesis of Compound 1

Compound 1-4 (2 eq) and $K_2PtCl_4$ (1 eq) were dissolved in a solvent of 2-ethoxyethanol:water (3:1), and stirred at about 80° C. for about 16 hours. To the resultant mixture, $Na_2CO_2$ (10 eq) dissolved in 2-ethoxyethanol and acetylacetone (3 eq) were injected, and stirred at about 100° C. for about 16 hours. The resultant reaction product was washed with ice water, filtered, separated by column chromatography and recrystallized to obtain Compound 1 (yield: 30%). High resolution EI-MS (M+) for $C_{14}H_8N_2S$ was as follows: found: 561.45; calc.: 561.48.

2. Synthesis of Compound 2

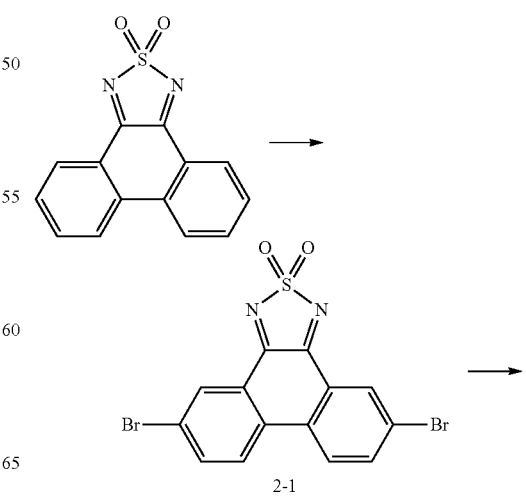

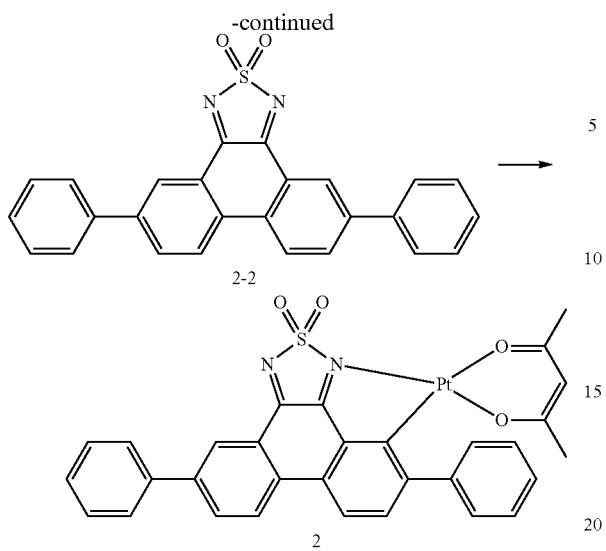

2-2

Synthesis of Compound 2-1

Under a nitrogen atmosphere, Compound 1-4 (1 eq) was dissolved in a THF solvent. In a lightless state at about 0° C., N-bromosuccinimide (2.2 eq) dissolved in a small amount of THF was slowly injected to the reaction mixture, followed by stirring at room temperature for about 8 hours. After finishing the reaction, the reaction mixture was extracted with a MC solvent, an organic layer was dried with $Na_2SO_4$, and solvents were removed. The crude product was separated by column chromatography to obtain Compound 2-1 (yield: 52%). $^1$H NMR ($CDCl_3$, 600 MHz): δ 8.50 (2H, s), 8.00-7.96 (4H, m).

Synthesis of Compound 2-2

Under a nitrogen atmosphere, Compound 1-4 (1 eq), phenylboronic acid (1.2 eq), $K_2CO_3$ (2 eq) and 5% $Pd(PPh_3)_4$ were stirred and refluxed in a toluene solvent for about 18 hours. After finishing the reaction, the resultant reaction mixture was extracted with an MC solvent, an organic layer was dried with $Na_2SO_4$, and solvents were removed. The crude product was separated by column chromatography to obtain Compound 2-2 (yield: 47%). $^1$H NMR ($CDCl_3$, 600 MHz): δ 8.60 (2H, s), δ 8.50 (4H, d), 8.30-8.28 (4H, d), 8.10-8.08 (4H, d), 8.00-7.96 (2H, m).

Synthesis of Compound 2

Compound 2-2 (2 eq) and $K_2PtCl_4$ (1 eq) were dissolved in a solvent of 2-ethoxyethanol:water (3:1), and stirred at about 80° C. for about 16 hours. To the resultant mixture, $Na_2CO_2$ (10 eq) dissolved in 2-ethoxyethanol and acetylacetone (3 eq) were injected, and stirred at about 100° C. for about 16 hours. The resultant reaction product was washed with ice water, filtered, separated by column chromatography and recrystallized to obtain Compound 2 (yield: 25%). High resolution EI-MS (M+) for $C_{14}H_8N_2S$ was as follows: found: 713.65; calc.: 713.67.

The above-described synthetic examples are only illustrations, and the reaction conditions may be changed according to need. In addition, the compound according to an exemplary embodiment of the inventive concept may be synthesized so as to include various substituents using methods and materials known in the art. By introducing various substituents in a core structure represented by Formula 1, appropriate properties for an organic electroluminescent device may be attained.

Device Manufacturing Examples

An organic electroluminescent device of Example 1 was manufactured using Compound 1 as a dopant material in an emission layer.

Example Compound

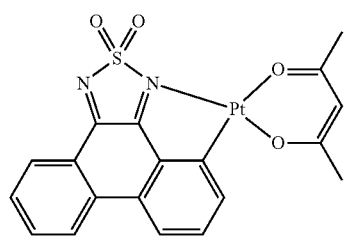

An organic electroluminescent device of Comparative Example 1 was manufactured using a known material, i.e., platinum phthalocyanine (PtPc) as a dopant material of an emission layer.

The organic electroluminescent devices of Example 1 and Comparative Example 1 were manufactured as follows. On a glass substrate, an ITO layer with a thickness of about 1200 Å was formed. Then, ultrasonic cleaning and pre-treatment (UV/$O_3$, heat treatment) were performed. On the pre-treated ITO transparent electrode, i) a hole injection layer (p-doping 1%, about 100 Å), ii) a hole transport layer (about 1100 Å), iii) an emission layer (host+dopant 1%, about 300 Å), iv) an electron transport layer (ET1+ET2, about 300 Å), v) an electron injection layer (LiF, about 5 Å), and vi) a second electrode (Al, about 1500 Å) were laminated one by one.

The materials of the electron injection/transport layer, the emission layer (host), and the electron transport layer are as follows.

(Hole Injection Layer Material)

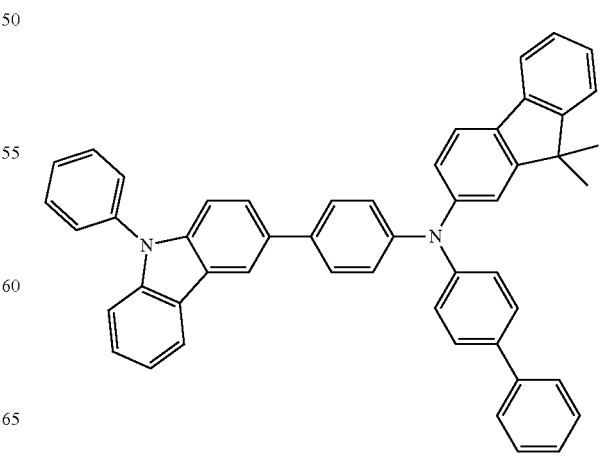

-continued

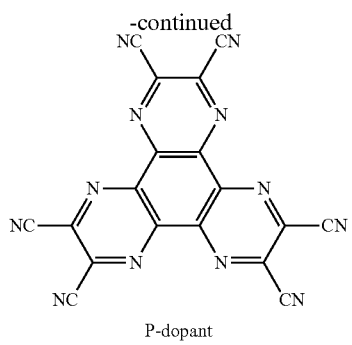

P-dopant (Hole Transport Layer Material)

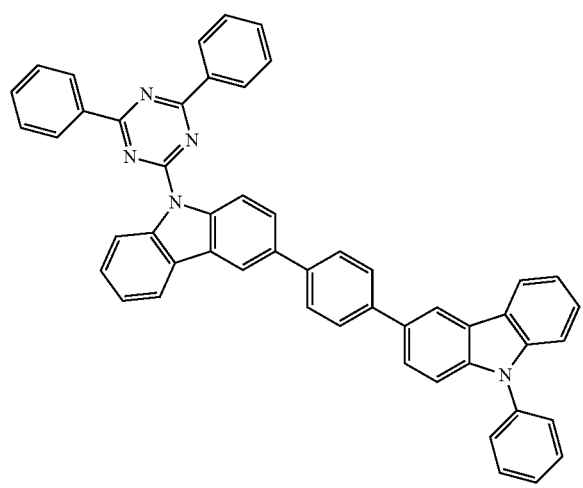

H-8
(Emission Layer Host)

(Electron Transport Layer Material)

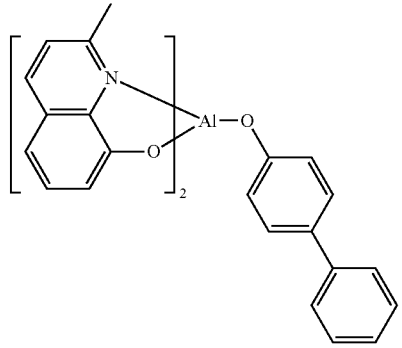

ET1

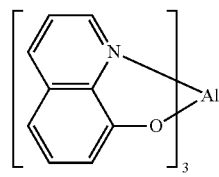

ET2

Then, the driving voltage, external quantum efficiency (EQE), and maximum emission wavelength of the organic electroluminescent devices thus manufactured were measured. Evaluation results are listed in Table 2 below. The driving voltage, EQE, etc. are measured values at a current density of about 100 mA/cm$^2$.

TABLE 1

| | Emission layer dopant material | Driving voltage (V) | External quantum efficiency (EQE, %) | Maximum emission wavelength λmax |
|---|---|---|---|---|
| Example 1 | Compound 1 | 6.4 | 1.03 | 826 |
| Comparative Example 1 | PtPc | 7.0 | 0.31 | 962 |

Referring to Table 1, it may be found that Example 1 had decreased driving voltage and increased efficiency when compared to Comparative Example 1. The organometallic compound according to an exemplary embodiment of the inventive concept emits near-infrared rays (NIR) and has more favorable efficiency and driving life in contrast to PtPc which is a known NIR emitting material.

The organic electroluminescent device according to an exemplary embodiment of the inventive concept and the organic electroluminescent display device including the same are capable of emitting near-infrared rays with high efficiency.

The organometallic compound according to an exemplary embodiment of the inventive concept may be used as a luminescent material of near-infrared rays, and if used in an organic electroluminescent device, the organometallic compound may contribute to the increase of efficiency.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organometallic compound represented by the following Formula 1:

[Formula 1]

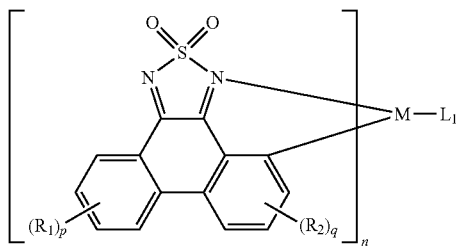

wherein in Formula 1,

R₁ and R₂ are each independently a hydrogen atom, a deuterium atom, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or are combined with an adjacent group to form a ring, "p" is an integer of 0 to 4, "q" is an integer of 0 to 3, "n" is 1 or 2, M is Pt, Ir or Os, and L₁ is a bidentate ligand.

2. The organometallic compound of claim 1, wherein L₁ is represented by one of the following Formulae 2-1 to 2-6:

[Formula 2-1]

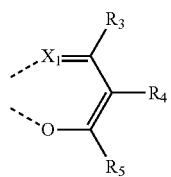

[Formula 2-2]

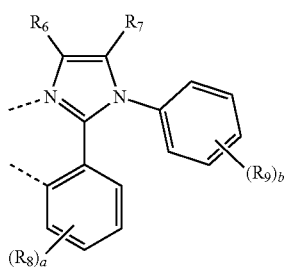

[Formula 2-3]

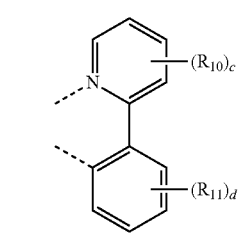

[Formula 2-4]

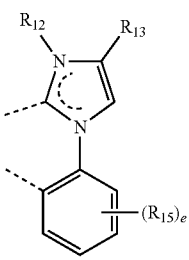

[Formula 2-5]

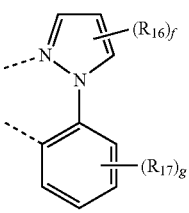

[Formula 2-6]

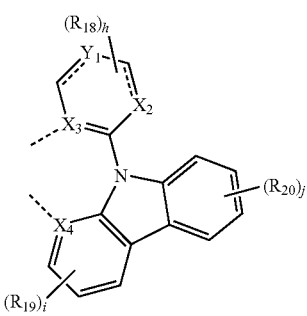

wherein in Formulae 2-1 to 2-6, $X_1$ is O or NR', $X_2$ to $X_4$ are each independently CH, N, or $NR_{21}$, $Y_1$ is a direct linkage or CH, R', and $R_3$ to $R_{21}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or are combined with an adjacent group to form a ring, "a", "c", "d", "e", "g" and "j" are each independently an integer of 0 to 4, "b" is an integer of 0 to 5, "f" and "i" are an integer of 0 to 3, and "h" is an integer of 0 to 2.

3. The organometallic compound of claim 1, wherein M is Pt.

4. The organometallic compound of claim 1, wherein Formula 1 is represented by one of the following Formulae 1-1 to 1-3:

[Formula 1-1]

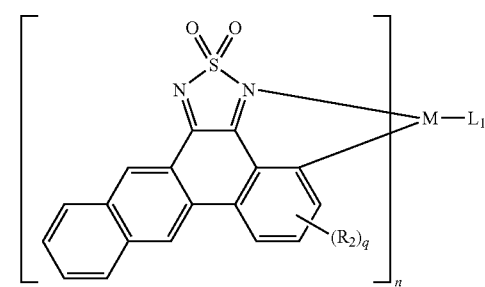

[Formula 1-2]

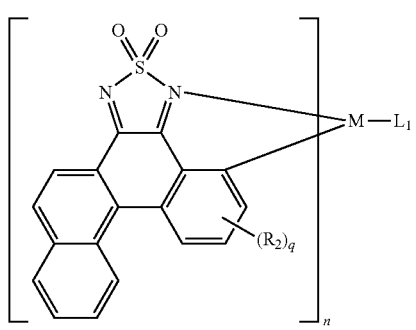

[Formula 1-3]

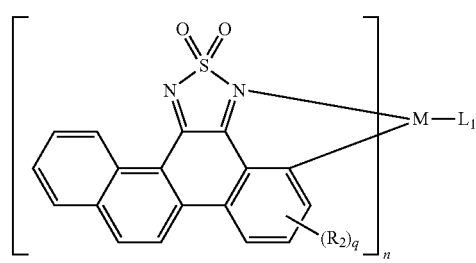

wherein in Formulae 1-1 to 1-3,

M, $R_2$, $L_1$, "n" and "q" are the same as defined in claim 1.

5. The organometallic compound of claim 1, wherein the organometallic compound represented by Formula 1 emits near-infrared rays in a wavelength region of 750 nm to 1,000 nm.

6. The organometallic compound of claim 1, wherein the organometallic compound represented by Formula 1 is at least one selected from compounds represented in the following Compound Group 1:

[Compound Group 1]

1

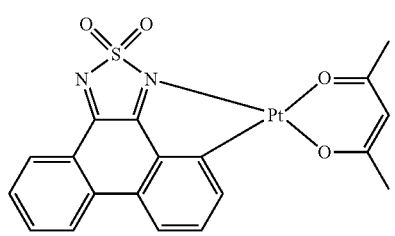

2

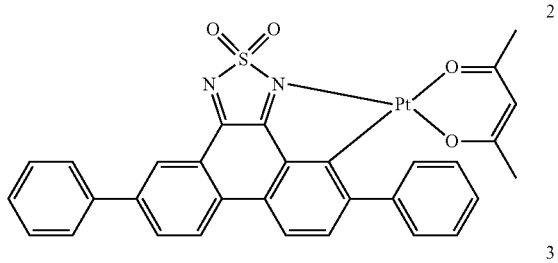

3

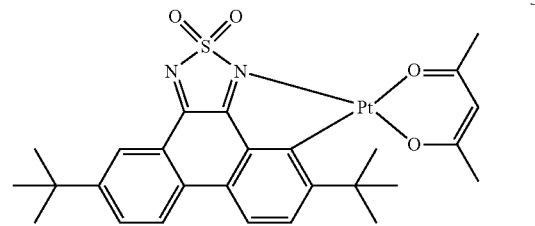

4

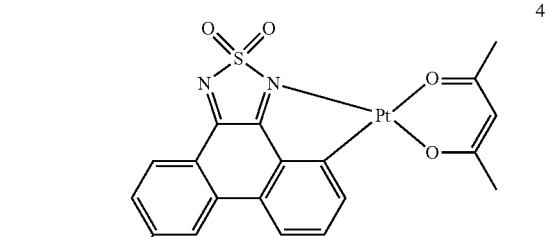

5

6

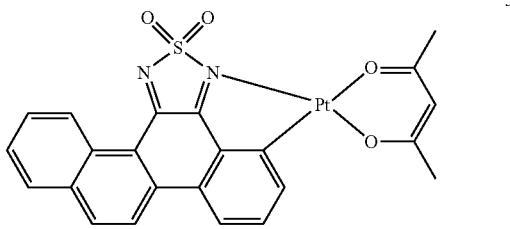

7

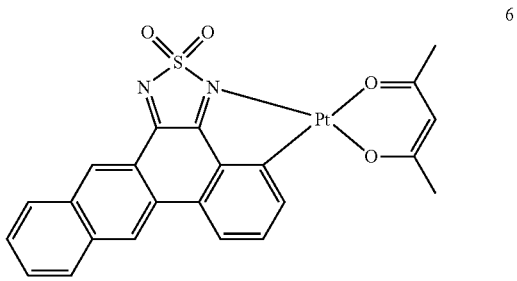

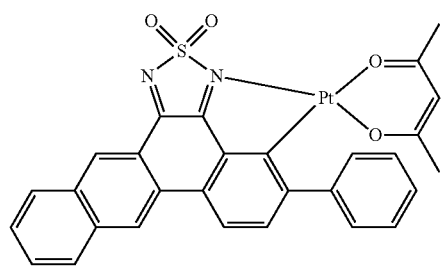
8
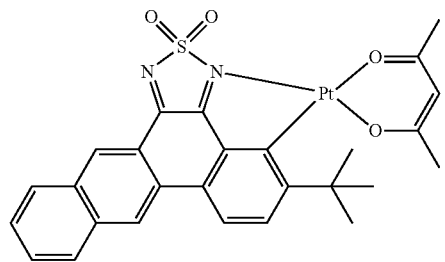
9
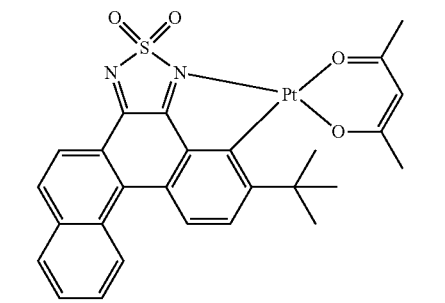
10
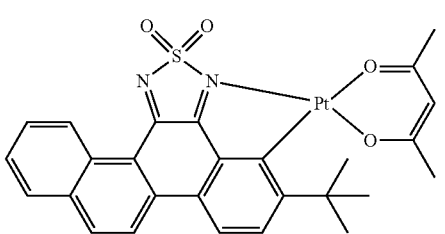
11
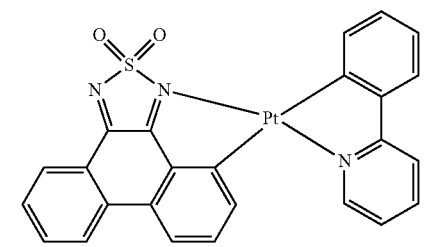
12
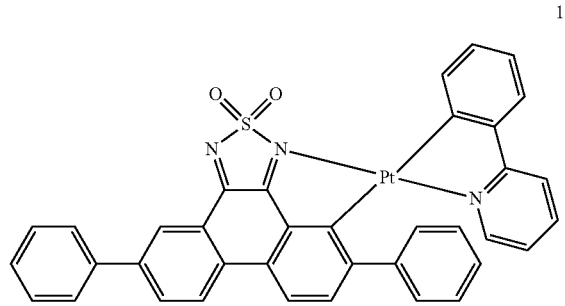
13
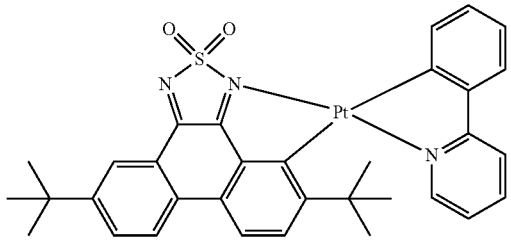
14
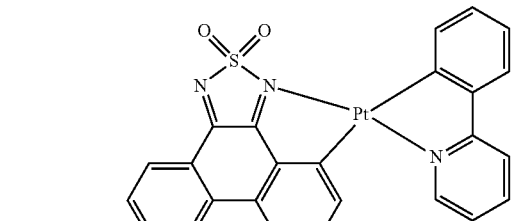
15
16
17
18

-continued

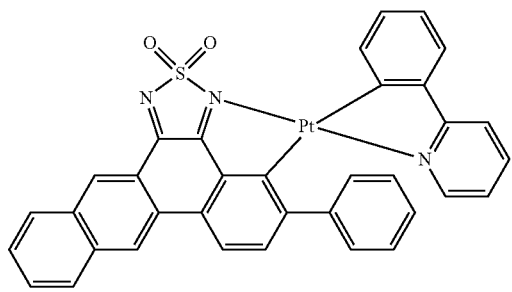
19

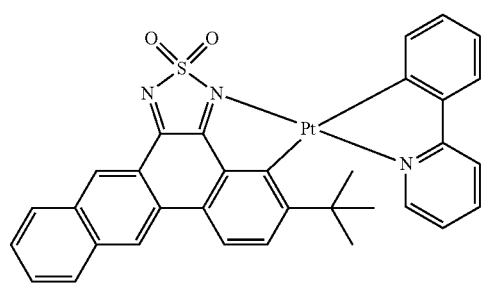
20

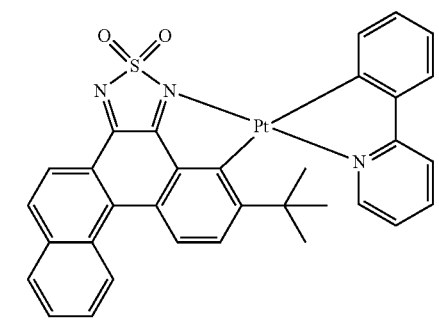
21

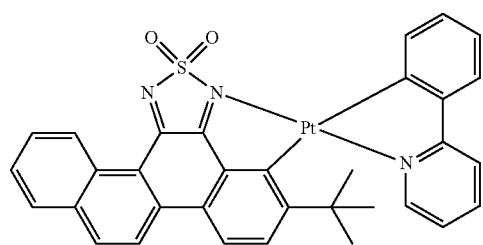
22

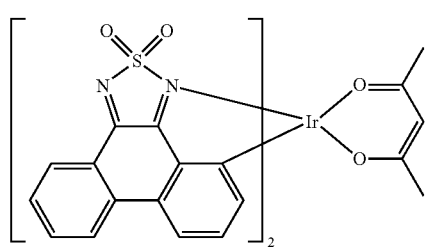
23

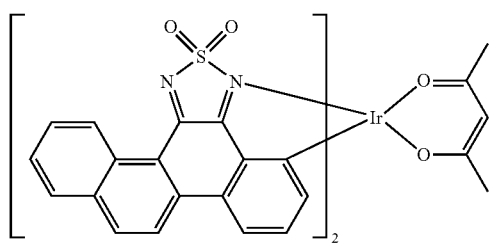
24

-continued

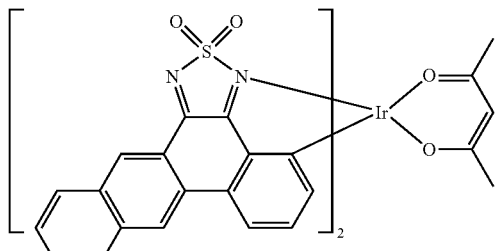
25

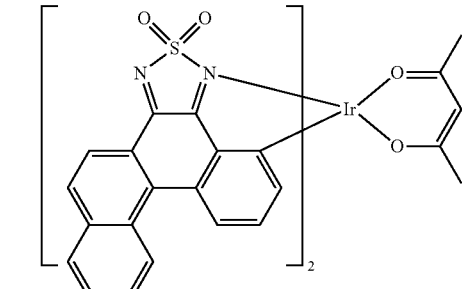
26

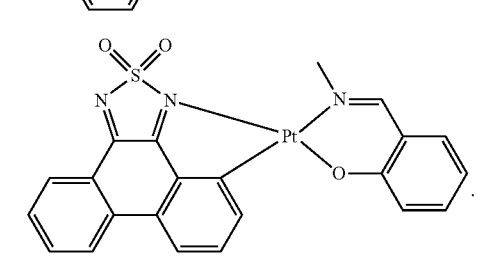
27

7. An organic electroluminescent device, comprising:
a first electrode;
a hole transport region provided on the first electrode;
an emission layer provided on the hole transport region;
an electron transport region provided on the emission layer; and
a second electrode provided on the electron transport region,
wherein the emission layer comprises an organometallic compound represented by the following Formula 1:

[Formula 1]

$$\left[ \begin{array}{c} \text{structure with } (R_1)_p \text{ and } (R_2)_q \text{ and } M-L_1 \end{array} \right]_n$$

wherein in Formula 1,
$R_1$ and $R_2$ are each independently a hydrogen atom, a deuterium atom, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or are combined with an adjacent group to form a ring, "p" is an integer of 0 to 4, "q" is an integer of 0 to 3, "n" is 1 or 2, M is Pt, Ir or Os, and $L_1$ is a bidentate ligand.

8. The organic electroluminescent device of claim 7, wherein $L_1$ is represented by one of the following Formulae 2-1 to 2-6:

[Formula 2-1]

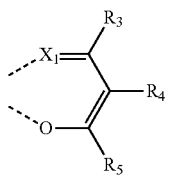

[Formula 2-2]

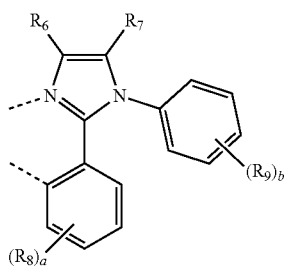

[Formula 2-3]

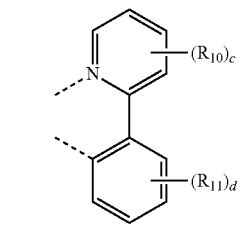

[Formula 2-4]

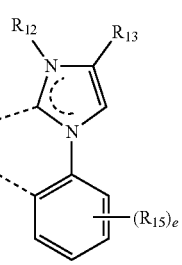

[Formula 2-5]

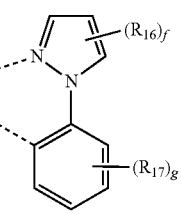

[Formula 2-6]

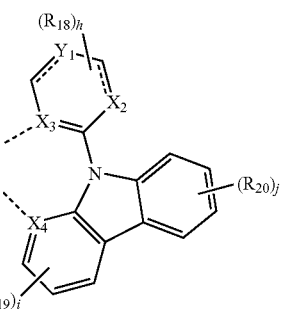

wherein in Formulae 2-1 to 2-6, $X_1$ is O or NR', $X_2$ to $X_4$ are each independently CH, N, or $NR_{21}$, $Y_1$ is a direct linkage or CH, R', and $R_3$ to $R_{21}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or are combined with an adjacent group to form a ring, "a", "c", "d", "e", "g" and "j" are each independently an integer of 0 to 4, "b" is an integer of 0 to 5, "f" and "i" are an integer of 0 to 3, and "h" is an integer of 0 to 2.

9. The organic electroluminescent device of claim 7, wherein M is Pt.

10. The organic electroluminescent device of claim 7, wherein Formula 1 is represented by one of the following Formulae 1-1 to 1-3:

[Formula 1-1]

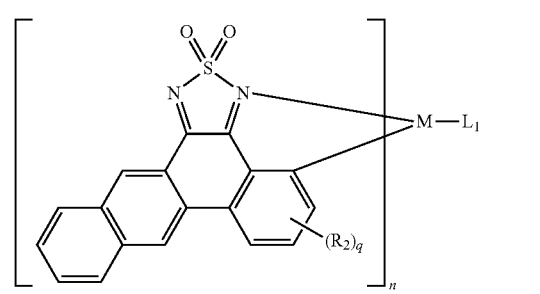

[Formula 1-2]

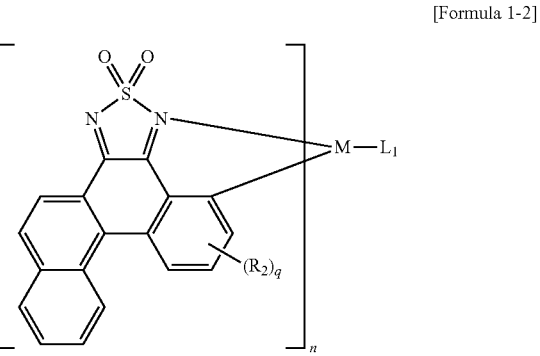

[Formula 1-3]

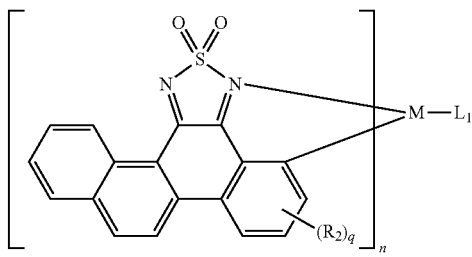

wherein in Formulae 1-1 to 1-3,

M, $R_2$, $L_1$, "n" and "q" are the same as defined in claim 7.

11. The organic electroluminescent device of claim 7, wherein the emission layer comprises a host and a dopant and emits near-infrared rays in a wavelength region of 750 nm to 1,000 nm, and the dopant comprises the organometallic compound represented by Formula 1.

12. The organic electroluminescent device of claim 7, wherein the organometallic compound represented by Formula 1 is at least one selected from compounds represented in the following Compound Group 1:

[Compound Group 1]

1
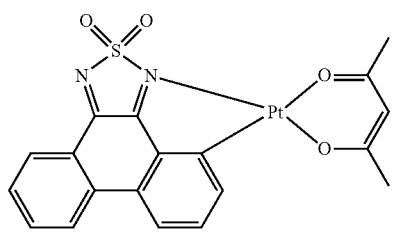

2
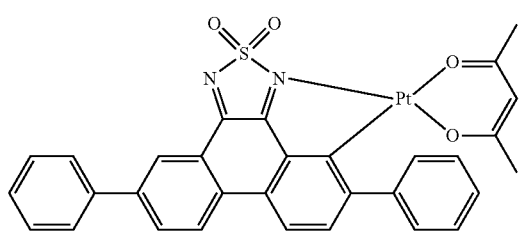

3
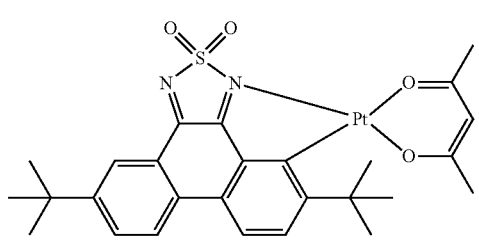

4
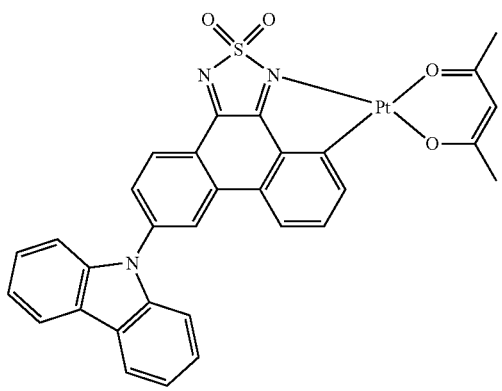

5
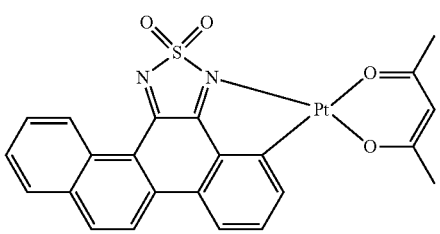

6
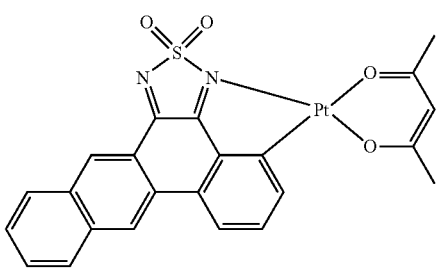

7
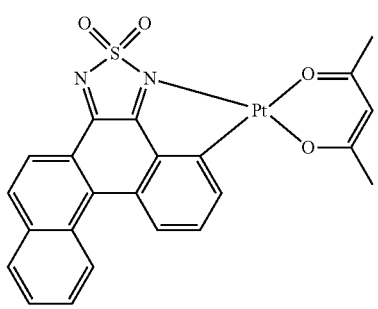

8
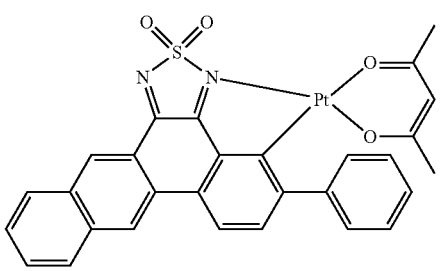

9
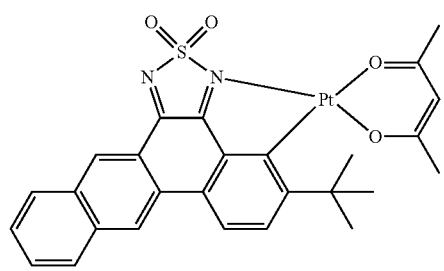
10
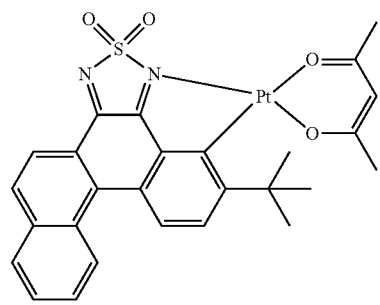
11
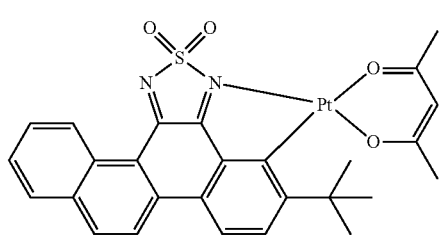
12
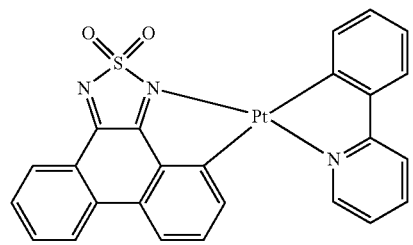
13
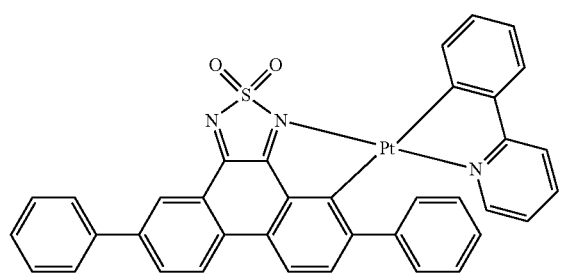
14
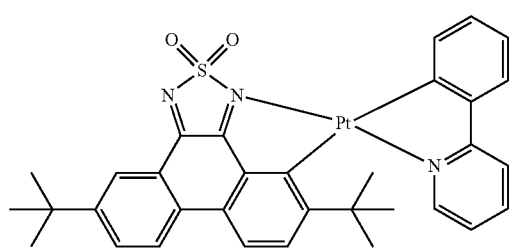
15
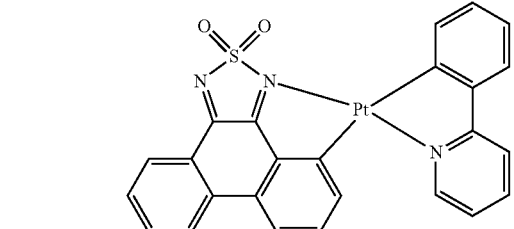
16
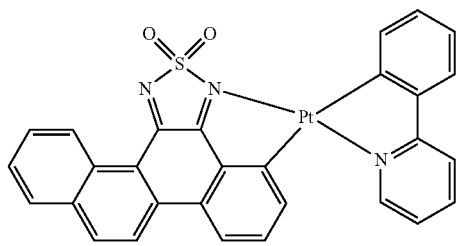
17
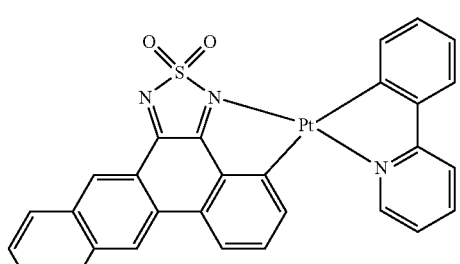
18
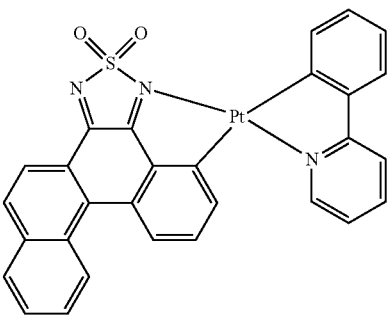
19
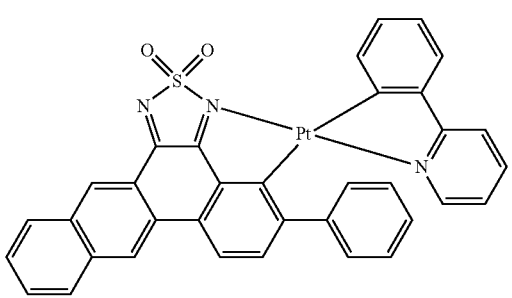

-continued

20
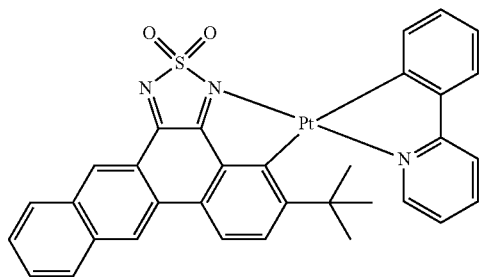

21
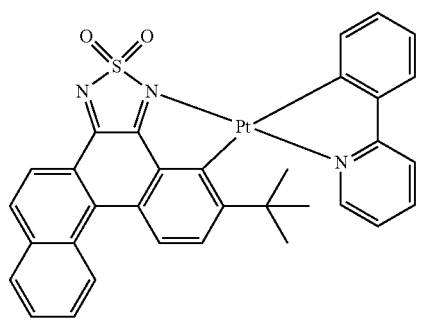

22
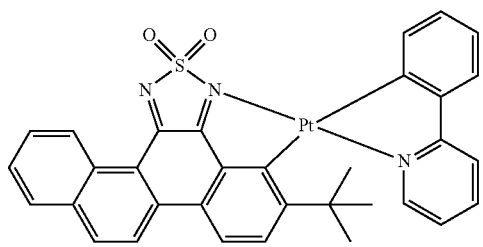

23
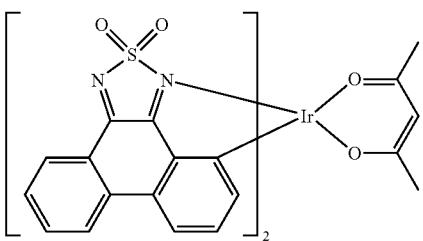

24
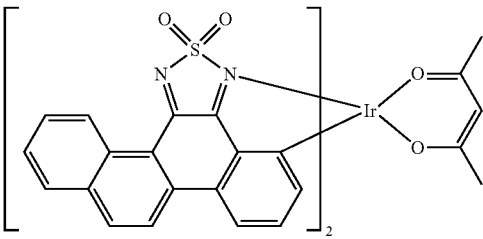

25
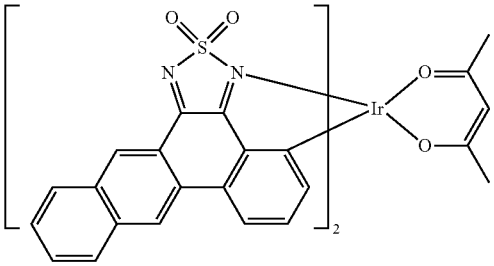

-continued

26
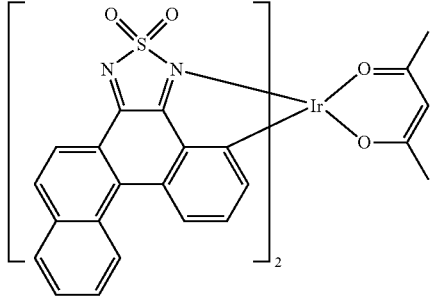

27
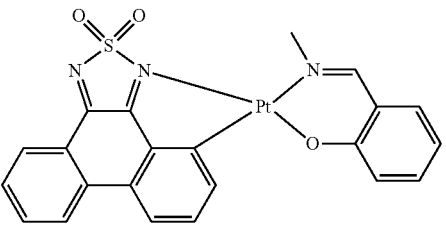

13. An organic electroluminescent display device, comprising:
 a first pixel comprising a first organic electroluminescent device which emits first visible rays;
 a second pixel comprising a second organic electroluminescent device which emits second visible rays;
 a third pixel comprising a third organic electroluminescent device which emits third visible rays; and
 a fourth pixel comprising a fourth organic electroluminescent device which emits near-infrared rays;
 wherein the fourth organic electroluminescent device comprises an emission layer comprising an organometallic compound represented by the following Formula 1:

[Formula 1]
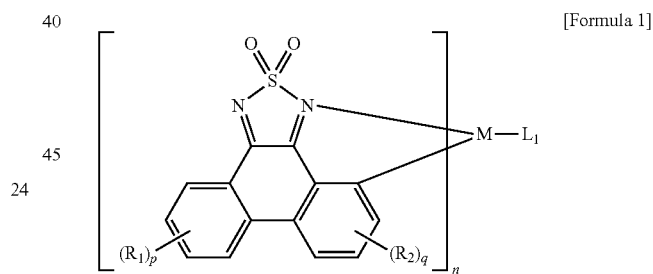

wherein in Formula 1,
 $R_1$ and $R_2$ are each independently a hydrogen atom, a deuterium atom, a substituted or unsubstituted alkyl group having 1 to 10 carbon atoms, a substituted or unsubstituted aryl group having 6 to 30 carbon atoms for forming a ring, or a substituted or unsubstituted heteroaryl group having 2 to 30 carbon atoms for forming a ring, or are combined with an adjacent group to form a ring,
 "p" is an integer of 0 to 4,
 "q" is an integer of 0 to 3,
 "n" is 1 or 2,
 M is Pt, Ir or Os, and
 $L_1$ is a bidentate ligand.
14. The organic electroluminescent display device of claim 13, wherein $L_1$ is represented by one of the following Formulae 2-1 to 2-6:

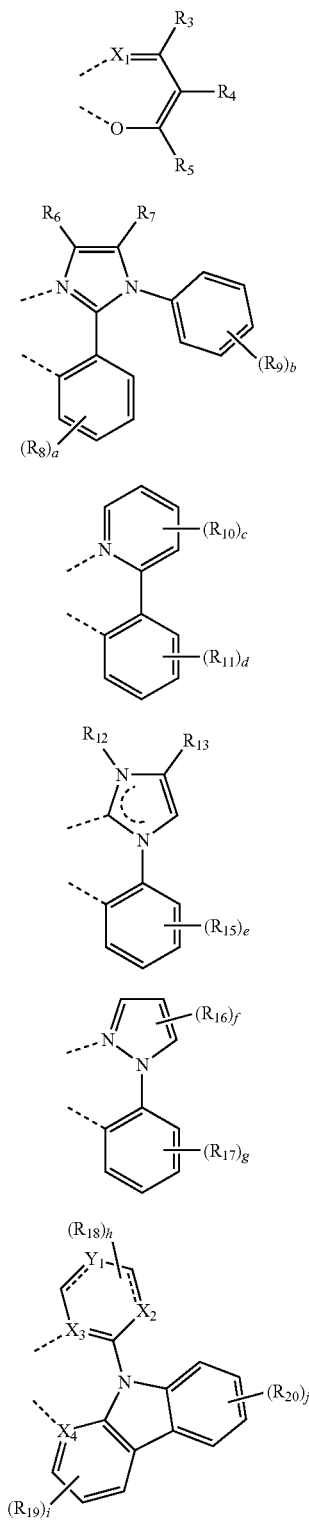

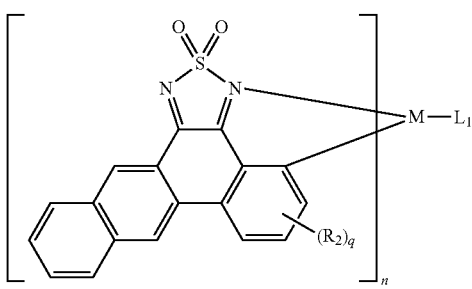

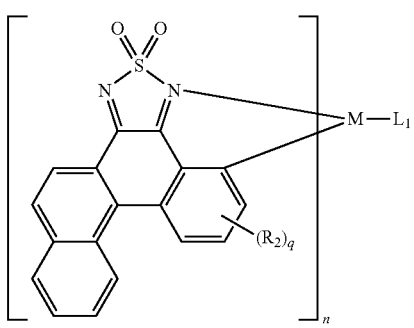

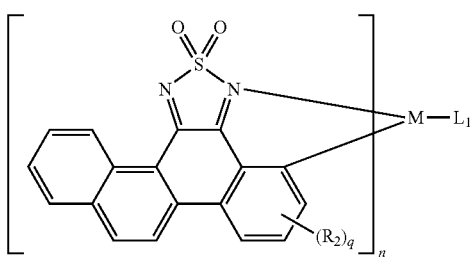

wherein in Formulae 2-1 to 2-6, $X_1$ is O or NR', $X_2$ to $X_4$ are each independently CH, N, or $NR_{21}$, $Y_1$ is a direct linkage or CH, R', and $R_3$ to $R_{21}$ are each independently a hydrogen atom, a deuterium atom, a substituted or unsubstituted alkyl group having 1 to 10 carbon atoms, or a substituted or unsubstituted aryl group having 6 to 30 carbon atoms for forming a ring, or are combined with an adjacent group to form a ring, "a", "c", "d", "e", "g" and "j" are each independently an integer of 0 to 4, "b" is an integer of 0 to 5, "f" and "i" are an integer of 0 to 3, and "h" is an integer of 0 to 2.

15. The organic electroluminescent display device of claim 13, wherein M is Pt.

16. The organic electroluminescent display device of claim 13, wherein Formula 1 is represented by one of the following Formulae 1-1 to 1-3:

wherein in Formulae 1-1 to 1-3,

M, $R_2$, $L_1$, "n" and "q" are the same as defined in claim 13.

17. The organic electroluminescent display device of claim 13, wherein the organometallic compound represented by Formula 1 emits near-infrared rays in a wavelength region of 750 nm to 1,000 nm.

18. The organic electroluminescent display device of claim 13, wherein the organometallic compound represented by Formula 1 is at least one selected from compounds represented in the following Compound Group 1:

[Compound Group 1]
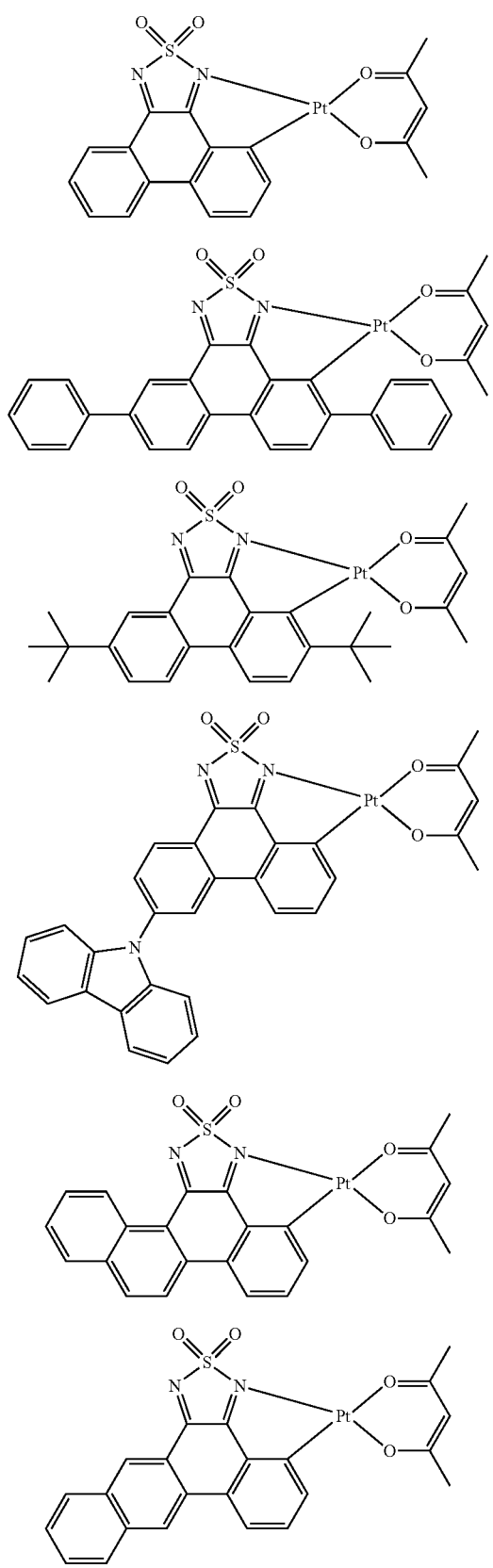
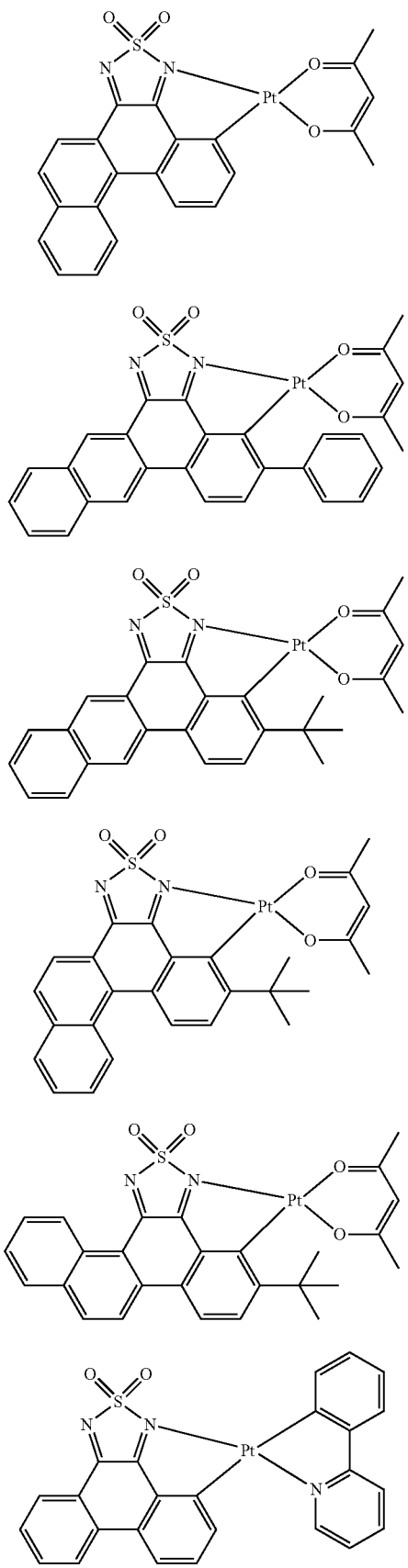

13
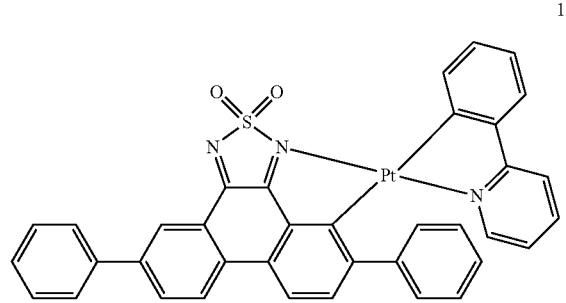
14
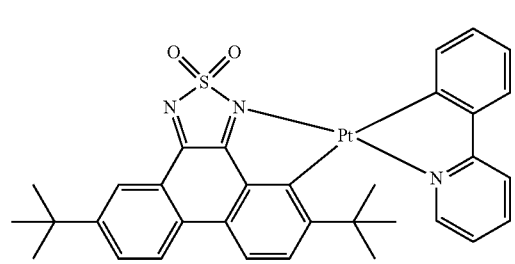
15
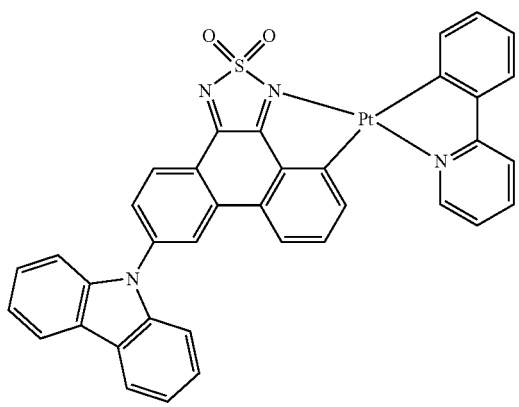
16
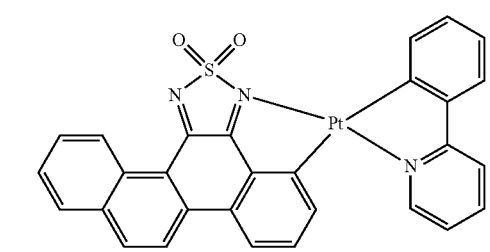
17
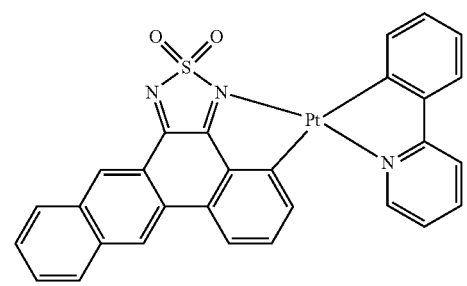
18
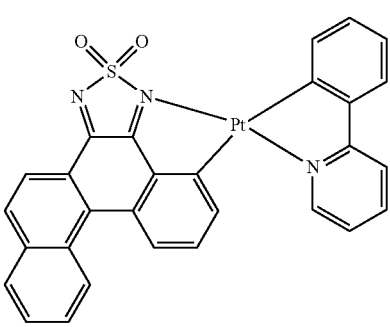
19
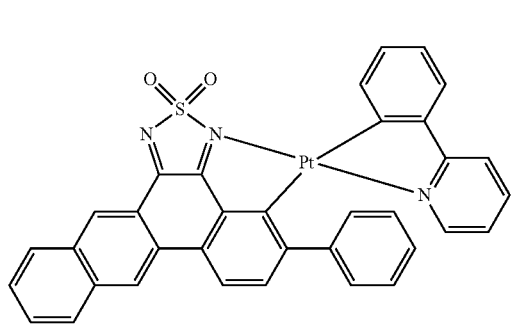
20
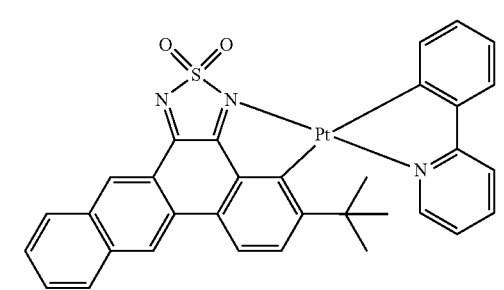
21
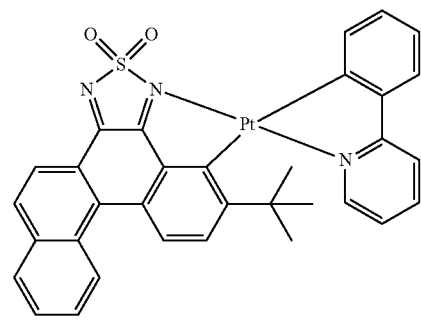
22
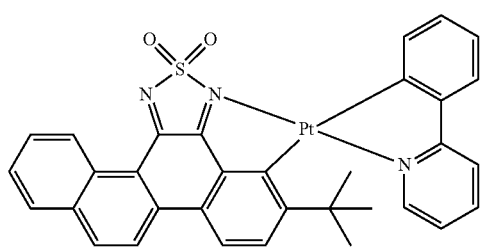

23
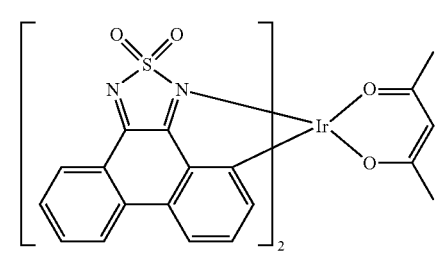
24
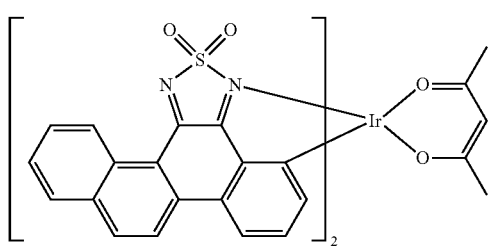
25
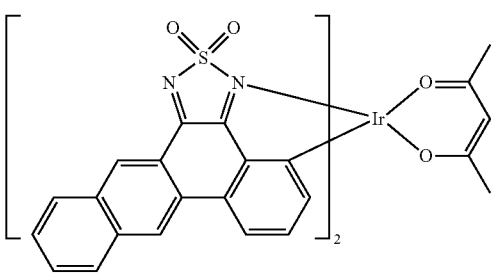
26
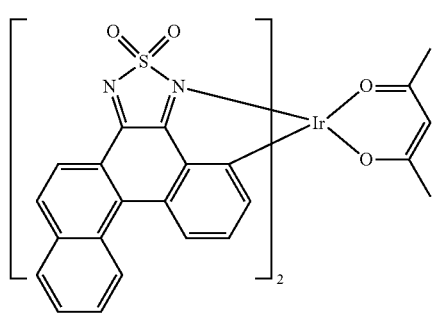
27
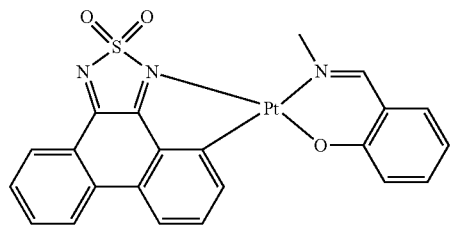
* * * * *